(12) United States Patent
Suemitsu et al.

(10) Patent No.: US 8,716,820 B2
(45) Date of Patent: May 6, 2014

(54) MAGNETIC MEMORY

(75) Inventors: Katsumi Suemitsu, Kanagawa (JP); Eiji Kariyada, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/609,230

(22) Filed: Sep. 10, 2012

(65) Prior Publication Data

US 2013/0075846 A1    Mar. 28, 2013

(30) Foreign Application Priority Data

Sep. 22, 2011    (JP) .................................. 2011-207927

(51) Int. Cl.
*H01L 29/82*    (2006.01)

(52) U.S. Cl.
USPC .......................................................... 257/421

(58) Field of Classification Search
CPC ..... H01L 27/02; H01L 27/226; H01L 27/228; H01L 43/02
USPC ........................................................ 257/421
See application file for complete search history.

(56) References Cited

U.S. PATENT DOCUMENTS

| | | | |
|---|---|---|---|
| 6,834,005 B1 | 12/2004 | Parkin | |
| 8,467,235 B2 * | 6/2013 | Slonczewski | 365/158 |
| 8,559,214 B2 * | 10/2013 | Fukami et al. | 365/158 |
| 2002/0027753 A1 * | 3/2002 | Ishiwata et al. | 360/324.2 |
| 2010/0188890 A1 | 7/2010 | Fukami et al. | |
| 2012/0278582 A1 * | 11/2012 | Fukami et al. | 711/166 |
| 2013/0021843 A1 * | 1/2013 | Mitou | 365/158 |
| 2013/0039122 A1 * | 2/2013 | Suzuki | 365/158 |
| 2013/0288392 A1 * | 10/2013 | Nozieres et al. | 438/3 |

FOREIGN PATENT DOCUMENTS

| | | |
|---|---|---|
| JP | 2005-191032 A | 7/2005 |
| WO | WO 2009/001706 A1 | 12/2008 |

OTHER PUBLICATIONS

Noburu Sakimura et al., "MRAM Cell Technology for Over 500-MHz SoC," IEEE Journal of Solid-State Circuits, vol. 42, No. 4, pp. 830-838, Apr. 2007.

A. Yamaguchi et al., "Real-Space Observation of Current-Driven Domain Wall Motion in Submicron Magnetic Wires," Physical Review Letters, vol. 92, No. 7, 077205, pp. 1-4, Feb. 2004.

(Continued)

*Primary Examiner* — Ngan Ngo
(74) *Attorney, Agent, or Firm* — Miles & Stockbridge P.C.

(57) ABSTRACT

A memory includes an underlying layer of a ferromagnetic body, a first nonmagnetic layer on the underlying layer, a data memorizing layer laid on the first nonmagnetic layer and made of a ferromagnetic body having perpendicular magnetic anisotropy, a reference layer coupled through a second nonmagnetic layer with the data memorizing layer, and first and second magnetization fixed layers laid underneath the underlying layer to come into contact with the underlying layer. The data memorizing layer includes a magnetization liberalized region having reversible magnetization, and overlapping with the reference layer, a first magnetization fixed region coupled with an end of the magnetization liberalized region, and having a magnetization direction fixed to +z direction by the first magnetization fixed layer, and a second magnetization fixed region coupled with a different end of the magnetization liberalized region, and having a magnetization direction fixed to −z direction by the second magnetization fixed layer.

6 Claims, 22 Drawing Sheets

(56) References Cited

OTHER PUBLICATIONS

S. Fukami et al., "Micromagnetic Analysis of Current Driven Domain Wall Motion in Nanostrips with Perpendicular Magnetic Anistropy," Journal of Applied Physics, 103, 07E718, pp. 1-3, 2008.

A. Thiaville et al., "Domain Wall Motion by Spin-Polarized Current: A Micromagnetic Study," Journal of Applied Physics, 95, pp. 7049-7051, 2004.

G. H. O. Daalderop et al., "Prediction and Confirmation of Perpendicular Magnetic Anistropy in Co/Ni Multilayers," Physical Review Letters, vol. 68, No. 5, pp. 682-685, Feb. 1992.

Tetsuhiro Suzuki et al., "Evaluation of Scalability for Current-Driven Domain Wall Motion in a Co/Ni Multilayer Strip for Memory Applications," IEEE Transaction on Magnetics, vol. 45, No. 10, pp. 3776-3779, Oct. 2009.

\* cited by examiner

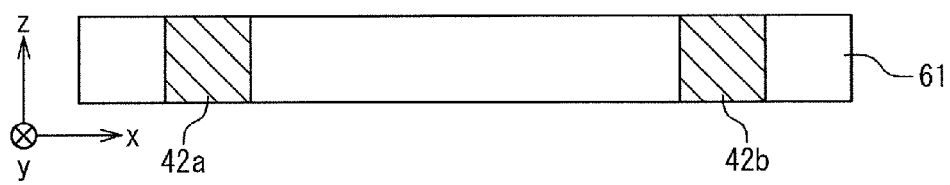
FIG. 11B
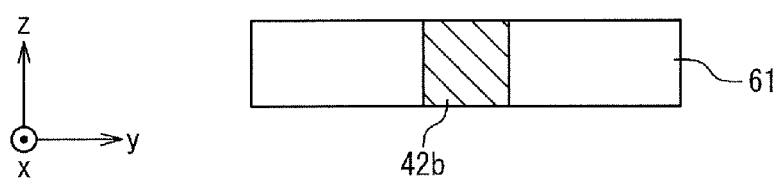
FIG. 11C
FIG. 12A
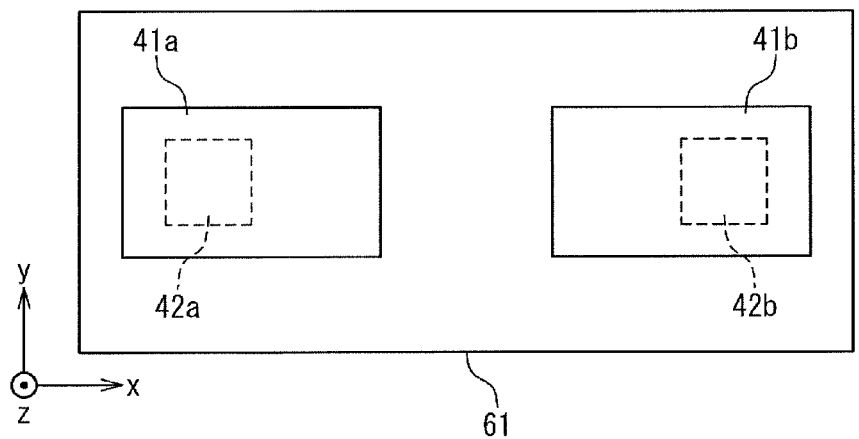

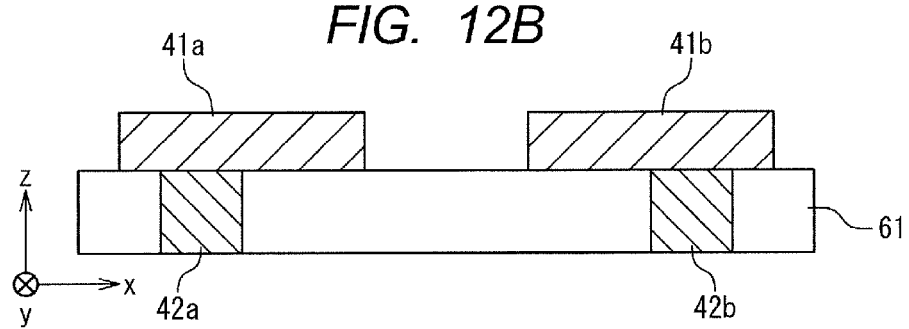
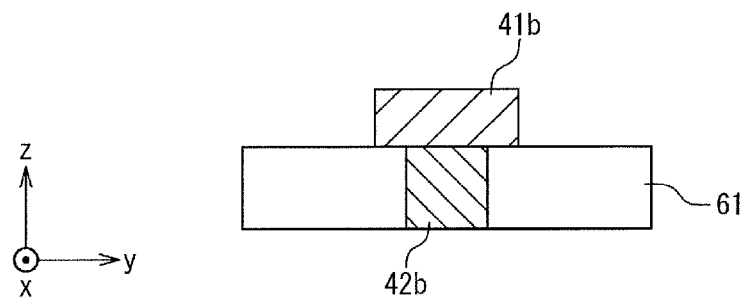
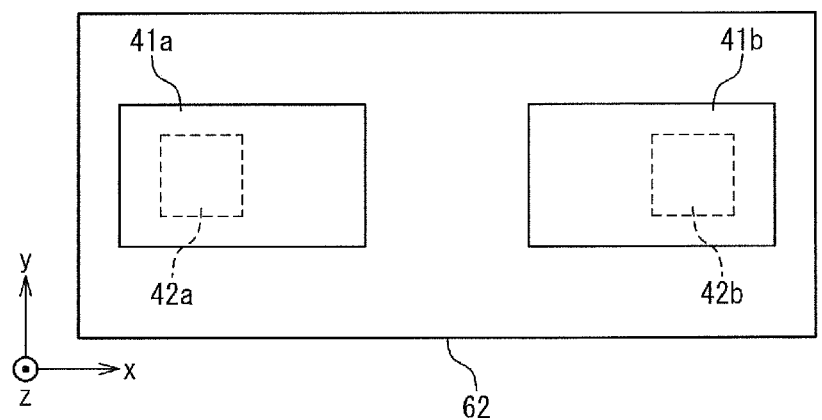

MAGNETIC MEMORY

CROSS-REFERENCE TO RELATED APPLICATIONS

The disclosure of Japanese Patent Application No. 2011-207927 filed on Sep. 22, 2011 including the specification, drawings and abstract is incorporated herein by reference in its entirety.

BACKGROUND

The present invention relates to a magnetic memory. The invention relates particularly to a magnetic memory of a domain wall motion type.

Magnetic memories, in particular, magnetic random access memories (MRAMs) are nonvolatile memories capable of attaining high-speed operation, and rewriting data unlimited times. MRAMs have partially started to be put into practical use, and have further developed to make the multiusability thereof higher. MRAMs each make use of a magnetic body as a memory element, and memorize a data corresponding to the direction of the magnetization of the magnetic body. In order to write a desired data into the memory element, the magnetization of the magnetic body is switched to a direction corresponding to the data. As the method for the magnetization-direction-switching, many methods are suggested. The methods are common to each other in that an electric current (hereinafter referred to as a "writing current") is used. To put MRAMs into practical use, very important is how much the writing current can be made small.

Non-Patent Document 1 (N. Sakimura et al., "MRAM Cell Technology for Over 500-MHz SoC", IEEE JOURNAL OF SOLID-STATE CIRCUITS, VOL. 42, NO. 4, pp. 830-838, 2007) states that by decreasing the writing current given to MRAMs to 0.5 mA or less, the cell area thereof is made equivalent to that of the existing consolidated SRAMs.

The most general one out of methods for writing data into an MRAM is a method of arranging an interconnect around the magnetic memory element, causing a writing current to flow into this interconnect to generate a magnetic field, and switching the magnetization direction of the magnetic memory element by effect of the magnetic field. According to this method, in principle, data can be written in a period of 1 nanosecond or less. Thus, this method is suitable for realizing a high-speed MRAM. However, a magnetic field for switching the magnetization of a magnetic body about which thermal stability and disturbed magnetic field resistance are certainly kept is generally about several tens of oersteds. In order to generate such a magnetic field, it is necessary to use a writing current of about several milliamperes. In this case, it is unavoidable to make the area of the chip (concerned) large. Moreover, the consumption power required for the writing is also increased. For these reasons, MRAMs are poorer in competitive power than other random access memories. Furthermore, when such elements are made fine, the writing current therefor is further increased. Thus, MRAMs are unfavorable from the viewpoint of scalability.

In recent years, in order to solve such problems, the following two manners have been suggested.

The first is the spin torque transfer manner. According to the spin torque manner, in a stacked film composed of a fist magnetic layer having reversible magnetization and a second magnetic layer coupled with the first layer and having a fixed magnetization direction, a writing current is caused to flow to the first and second layers across these layers. At this time, conductive electrons the spins of which are polarized interact with localized electrons in the first magnetic layer, whereby the magnetization of the first magnetic layer can be reversed. When the written data is read, use is made of magnetoresistance effect generated between the first and second magnetic layers. Accordingly, the magnetic memory element in which spin torque transfer is used is a two-terminal element. Spin torque transfer is caused when the current density in this element is some value or more; thus, as the element size is smaller, the current required for writing is made smaller. In other words, it can be mentioned that the spin torque transfer manner is excellent in scalability. In general, however, an insulating layer is laid between the first and second magnetic layers; thus, when a data is written, it is indispensable to cause a relatively large writing current to flow through this insulating layer to the magnetic layers across the layers. As a result, the manner has problems about rewriting resistance and reliability. Moreover, the writing current path thereof is identical with the reading-out current path thereof, so that an incorrect data may be unfavorably written at the time of readout. As described herein, several barriers rise up against the practical use of the spin torque transfer manner although this manner is excellent in scalability.

The second is the current driven domain wall motion manner. MRAMs using current driven domain wall motion is disclosed in, for example, Patent Document 1 (Japanese Unexamined Patent Publication No. 2005-191032). In an MRAM of a general current driven domain wall motion type, a magnetic layer having reversible magnetization (data memorizing layer for memorizing data) is laid, and (partial) magnetizations at both ends of the data memorizing layer are fixed to be substantially antiparallel with each other. By such a magnetization arrangement, a domain wall is introduced in the data memorizing layer. As reported in Non-Patent Document 2 (Non-Patent Document 2: A. Yamaguchi et al., "Real-Space Observation of Current-Driven Domain Wall Motion in Submicron Magnetic Wires", PHYSICAL REVIEW LETTERS, VOL. 92, NO. 7, 077205, 2004), when a current is caused to flow into a domain wall along a domain-wall-penetrating direction, the domain wall is moved into the direction of the conductive electrons (concerned). Accordingly, by causing a writing current in the in-plane direction to flow into the data memorizing layer, the domain wall is moved into a direction corresponding to the current, so that a desired data can be written. When the data is read out, a magnetic tunnel junction containing a region where the domain wall is moved is used to read out the data on the basis of magnetoresistance effect. Accordingly, the magnetic memory element in which current driven domain wall motion is used is a three-terminal element. In the same manner as spin torque transfer, current driven domain wall motion is also caused when the current density in the element is some value or more. It can be therefore mentioned that the current driven domain wall motion manner is excellent in scalability. Additionally, in the current driven domain wall motion manner, no writing current flows into the insulating layer, and further the writing current path is different from the reading-out current path. Accordingly, the above-mentioned problems caused in the spin torque transfer manner are solved. Non-Patent Document 2 described above reports that the current density necessary for current driven domain wall motion is about $1 \times 10^8$ A/cm$^2$.

Non-Patent Document 3 (S. Fukami et al., "Micromagnetic analysis of current driven domain wall motion in nanostrips with perpendicular magnetic anisotropy", JOURNAL OF APPLIED PHYSICS, VOL. 103, 07E718, 2008) states the usefulness of perpendicular magnetic anisotropic material. Specifically, it is made evident through micromagnetic simulation that when a data memorizing layer in which domain wall motion is caused has perpendicular magnetic anisotropy, the writing current therefor can be sufficiently decreased.

Patent Document 3 (International Publication WO/2009/001706) discloses a magnetoresistance effect element making use of a magnetic body having perpendicular magnetic anisotropy, and an MRAM having this element as a memory cell. FIG. 1 is a sectional view that schematically illustrates an example of the magnetoresistance effect element disclosed in this publication. The magnetoresistance effect element has a magnetic memory layer 110, a spacer layer 120, and a reference layer 130.

The magnetic memory layer 110 is made of a ferromagnetic body having perpendicular magnetic anisotropy. The magnetic memory layer 110 has a first magnetization fixed region 111a, a second magnetization fixed region 111b, and a magnetization liberalized region 113. The magnetization fixed regions 111a and 111b are arranged at both sides of the magnetization liberalized region 113, respectively. The magnetizations of the magnetization fixed regions 111a and 11b are fixed in directions reverse (antiparallel) to each other. As illustrated in FIG. 1, for example, the magnetization direction of the first magnetization fixed region 111a is fixed to +z direction; and that of the second magnetization fixed region 111b, to −z direction. The magnetization direction of the magnetization liberalized region 113 is reversible through a writing current flowing from any one of the magnetization fixed regions to the other, so as to be +z direction or −z direction. Thus, in accordance with the magnetization direction of the magnetization liberalized region 113, a domain wall 112a or 112b is formed inside the magnetic memory layer 110. A data is memorized as the direction of the magnetization of the magnetization liberalized region 113. The data may be regarded as being memorized as the position of the domain wall 112 (112a or 112b). The reference layer 130 which is made of a ferromagnetic body having a fixed magnetization direction, the spacer layer 120 which is a nonmagnetic layer (insulating layer), and the magnetization liberalized region 113 form a magnetic tunnel junction (MJT). Any data is read out as a large or small resistance value of the MJT.

This document, Patent Document 3, discloses that when the magnetic memory layer 110 has perpendicular magnetic anisotropy, the writing current can be decreased.

Out of material objects having perpendicular magnetic anisotropy, stacked films made of Co and Ni, of Co and Pt, and of Co and Pd, respectively, are generally known. A Pt or Pd layer may be laid on or beneath the stacked film of Co and Ni, or interposed between two layers thereof. The material used for hard disk media is, for example, CoCr based alloy, or a mixture of CoCr based alloy, and $SiO_2$ or $TiO_2$. The material used for magnetooptical recording media is, for example, TbFeCo.

CITATION LIST

Patent Documents

Patent Document 1: Japanese Unexamined Patent Publication No. 2005-191032
Patent Document 2: U.S. Pat. No. 6,834,005
Patent Document 3: International Publication WO/2009/001706

Non-Patent Documents

Non-Patent Document 1: N. Sakimura et al., "MRAM Cell Technology for Over 500-MHz SoC", IEEE JOURNAL OF SOLID-STATE CIRCUITS, VOL. 42, NO. 4, pp. 830-838, (2007)

Non-Patent Document 2: A. Yamaguchi et al., "Real-Space Observation of Current-Driven Domain Wall Motion in Submicron Magnetic Wires", PHYSICAL REVIEW LETTERS, VOL. 92, NO. 7, 077205, (2004)

Non-Patent Document 3: S. Fukami et al., "Micromagnetic analysis of current driven domain wall motion in nanostrips with perpendicular magnetic anisotropy", JOURNAL OF APPLIED PHYSICS, VOL. 103, 07E718, (2008)

Non-Patent Document 4: A. Thiaville et al., "Domain wall motion by spin-polarized current: a micromagnetic study", JOURNAL OF APPLIED PHYSICS, VOL. 95, NO. 11, pp. 7049-7051, (2004)

Non-Patent Document 5: G. H. O. Daalderop et al., "Prediction and Confirmation of Perpendicular Magnetic Anisotropy in Co/Ni Multilayers", PHYSICAL REVIEW LETTERS, VOL. 68, NO. 5, pp. 682-685, (1992)

Non-Patent Document 6: T. Suzuki et al., "Evaluation of Scalability for Current-Driven Domain Wall Motion in a Co/Ni Multilayer Strip for Memory Applications", IEEE TRANSACTIONS ON MAGNETICS, VOL. 45, NO. 10, pp. 3776-3779, (2009)

SUMMARY

As described above, it is important for lowering the constant current of an MRAM that its ferromagnetic body film (for example, the magnetic memory layer 110) has perpendicular magnetic anisotropy. It is also important for the memorization of data by domain wall motion that the ferromagnetic body film has suitability (for example, height in spin polarizability) for domain wall motion. The suitability of the ferromagnetic body film for perpendicular magnetic anisotropy and domain wall motion is affected not only by the selected material but also by the material or the structure of an underlying layer on which the ferromagnetic body film is to be formed. Thus, in order to give a film high in perpendicular magnetic anisotropy and suitability for domain wall motion, it is important to select the material or the structure of the underlying layer, as well as the material of the ferromagnetic body film.

The material object that has perpendicular magnetic anisotropy and is suitable for domain wall motion is, for example, a stacked film of Co and Ni that is formed on Pt ([Co/Ni]n/Pt film wherein n represents the number of times of the stacking of a combination of Co with Ni, and is a natural number). The stacked film of Co and Ni is favorable since the film is high in spin polarizability. On the other hand, the stacked film of Co and Ni is unfavorable since the film is lower in perpendicular magnetic anisotropy than a stacked film of Co and Pt, or Co and Pd. However, when the stacked film of Co and Ni is formed on a Pt film, the resultant is high in perpendicular magnetic anisotropy so that the unfavorableness is overcome.

The [Co/Ni]n/Pt film turns high in perpendicular magnetic anisotropy when the Co/Ni layers are oriented to fcc (111). However, the crystal orientation of the Co/Ni layers is varied in accordance with the material of the underlying layer of the [Co/Ni]n/Pt film. Correspondingly thereto, the perpendicular magnetic anisotropy thereof is also varied. It is therefore important to select the material of the underlying layer of the [Co/Ni]n/Pt film appropriately.

About the magnetization fixed regions 111a and 111b in FIG. 1, the fixation of the magnetizations thereof may be attained by magnetic coupling between these regions and a magnetization fixed layer (not illustrated) underneath the regions. In this case, it is important that the underlying layer of the magnetic memory layer (ferromagnetic body film having perpendicular magnetic anisotropy) 110 does not produce any effect onto the magnetic coupling between the magnetization fixed regions 111a and 111b, and the magnetization fixed layer. When the film thickness of the underlying layer of the magnetic memory layer 110 is too large, the magnetic coupling is broken so that the function of data-memorization based on domain wall motion may be unfavorably lost.

Furthermore, when a thermal treatment is conducted in any step after the step of forming the ferromagnetic body film, the perpendicular magnetic anisotropy may be changed by temperature for the thermal treatment. The change in the perpendicular magnetic anisotropy by the thermal treatment is varied in accordance with the material of the underlying layer. It is therefore important from this viewpoint also to select the underlying layer of the ferromagnetic body layer appropriately.

For example, in a Cu interconnecting step, the temperature for the thermal treatment is about 350° C. In the future, this thermal treatment temperature in the step may be lowered. It is therefore necessary to select the material of the underlying layer within the range of 350° C. or lower to enhance the perpendicular magnetic anisotropy of the ferromagnetic body layer.

An underlying layer is desired which improves the perpendicular magnetic anisotropy of a ferromagnetic body film of a magnetic memory layer, and/or the suitability of the film for domain wall motion. The underlying layer is further desired to produce no bad effect onto magnetic coupling between the magnetization fixed regions of the ferromagnetic body layer, and the magnetization fixed layer (concerned), and make the ferromagnetic body layer strong against thermal treatment. A magnetic memory is desired which has a ferromagnetic body layer giving an intense perpendicular magnetic anisotropy even when the manufacturing method of the memory is finished.

In present item "SUMMARY", aspects of the present invention will be described hereinafter with auxiliary use of reference numbers and symbols to be used in item "DETAILED DESCRIPTION". These reference numbers and symbols are attached with respective parentheses in order to make clear a corresponding relationship between the subject matters recited in the attached claims (and the aspects described herein), and embodiments described in item "DETAILED DESCRIPTION". However, it is impermissible to use the reference numbers and symbols to interpret the technical scope of the invention recited in the claims.

The magnetic memory of the invention includes an underlying layer (51), a first nonmagnetic layer (52, 521), a data memorizing layer (53), a reference layer (30), a first magnetization fixed layer (41a), and a second magnetization fixed layer (41b). The underlying layer (51) includes a ferromagnetic body. The first nonmagnetic layer (52, 521) is laid over the underlying layer (51). The data memorizing layer (53) is laid over the first nonmagnetic layer (52, 521) and includes a ferromagnetic body having perpendicular magnetic anisotropy. The reference layer (30) is coupled through a second nonmagnetic layer (20) with the data memorizing layer (53). The first magnetization fixed layer (41a) and the second magnetization fixed layer (41b) are laid underneath the underlying layer (51) to come into contact with the underlying layer (51). The data memorizing layer (53) includes a magnetization liberalized region (13), a first magnetization fixed region (11a) and a second magnetization fixed region (11b). The magnetization liberalized region (13) has reversible magnetization, and overlaps with the reference layer (30). The first magnetization fixed region (11a) is coupled with a first boundary of the magnetization liberalized region (13), and has a magnetization direction fixed to a first direction (+z) by effect of the first magnetization fixed layer (41a). The second magnetization fixed region (11b) is coupled with a second boundary of the magnetization liberalized region (13), and has a magnetization direction fixed to a second direction (−z) reverse to the first direction (+z) by effect of the second magnetization fixed layer (41b). A portion of the first nonmagnetic layer (52, 521) that is a portion underneath the magnetization liberalized region (13) is thicker than a portion of the first nonmagnetic layer (52, 521) that is a portion underneath each of the first and second magnetization fixed regions (11a) and (11b).

The method of the invention for manufacturing a magnetic memory, includes the steps of: stacking, over a first magnetization fixed layer (41a) and a second magnetization fixed layer (41b) laid apart from each other, an underlying ferromagnetic film (51a) for an underlying layer, and a first nonmagnetic film (52a, 521a) for a first nonmagnetic layer in this order; not only making at least one portion of the first nonmagnetic layer (52a, 521a) that is a portion over the first magnetization fixed layer (41a) thinner than the other portion of the nonmagnetic layer, but also making at least one portion of the first nonmagnetic layer (52a, 521a) that is a portion over the second magnetization fixed layer (41b) thinner than the other portion of the nonmagnetic layer; stacking, over the first nonmagnetic film (52a, 521a), a first ferromagnetic body film (53a) for a data memorizing layer that has perpendicular magnetic anisotropy, a second nonmagnetic film (20a) for a second nonmagnetic layer, and a second ferromagnetic body film (30a) for a reference layer in this order; working each of the second ferromagnetic body film (30a), the second nonmagnetic film (20a), the first ferromagnetic body film (53a), the first nonmagnetic film (52a, 521a), and the underlying ferromagnetic film (51a) into an element shape, thereby forming the underlying layer, the first nonmagnetic layer, and the data memorizing layer; and working each of the second ferromagnetic body film (30a), and the second nonmagnetic film (20a) to be made consistent with the reference layer (30) in shape, thereby forming the second nonmagnetic layer and the reference layer.

The invention makes it possible to realize a data memorizing layer having perpendicular magnetic anisotropy that is suitable for a magnetoresistance effect element using domain wall motion, and for a magnetic random access memory (MRAM) using this element.

BRIEF DESCRIPTION OF THE DRAWINGS

FIG. 11B is an xz sectional view illustrating this step.

FIG. 11C is a yz sectional view illustrating this step.

FIG. 12A is a plane view illustrating a step in the manufacturing method.

FIG. 12B is an xz sectional view illustrating this step.

FIG. 12C is a yz sectional view illustrating this step.

FIG. 13A is a plane view illustrating a step in the manufacturing method.

DETAILED DESCRIPTION

First Embodiment

Figure 1:
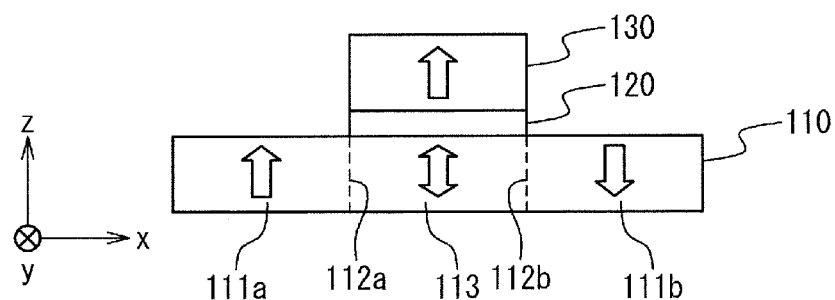
FIG. 1 is a sectional view that schematically illustrates a magnetoresistance effect element in International Publication WO/2009/001706.
Figure 2:
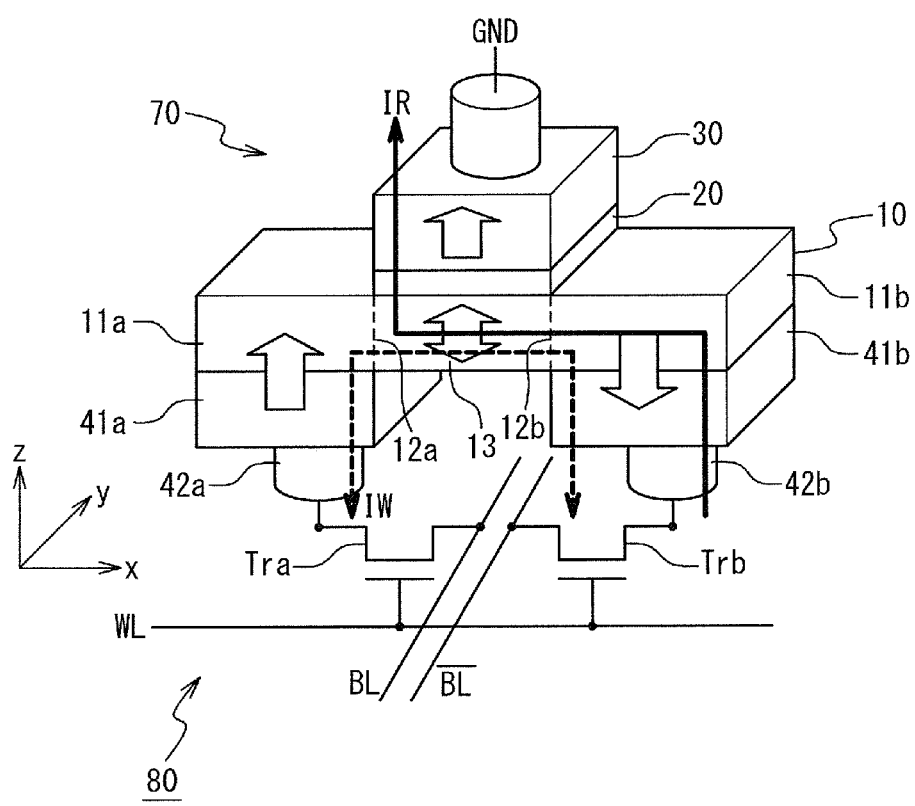
FIG. 2 is a schematic view illustrating a general structure of a main portion of a magnetic memory according to a first embodiment of the invention.

Hereinafter, a magnetic memory according to a first embodiment of the invention will be described with reference to some of the attached drawings. FIG. 2 is a schematic view illustrating a general structure of a main portion of the magnetic memory according to the first embodiment. The magnetic memory is an example of a magnetic random access memory (MRAM), and has plural magnetic memory cells 80 arranged in a matrix form.

Each of the magnetic memory cells 80 has a magnetoresistance effect element 70, and select transistors Tra and Trb. About the select transistor Tra, its gate is coupled with a word line WL while one of its source/drain is coupled with a bit line BL and the other is coupled with a first magnetization fixed layer 41a, which will also be described below, of the magnetoresistance effect element 70 through a first electrode layer 42a. About the select transistor Trb, its gate is coupled with the word line WL while one of its source/drain is coupled with a bit line BL and the other is coupled with a second magnetization fixed layer 41b, which will also be described below, of the magnetoresistance effect element 70 through a second electrode layer 42b.

The magnetoresistance effect element 70 has a magnetic memory layer (or magnetic recording layer) 10, a spacer layer 20, and a reference layer 30. The element 70 may further have the first magnetization fixed layer 41a and the second magnetization fixed layer 41b.

The magnetic memory layer 10 includes a magnetization liberalized region 13, a first magnetization fixed region 11a, and a second magnetization fixed region 11b. The magnetization liberalized region 13 is made of a ferromagnetic body having perpendicular magnetic anisotropy. The magnetization liberalized region 13 can undergo magnetization reversal. In accordance with the magnetization state thereof, the magnetization liberalized region memories a data. At both sides of the magnetization liberalized region 13, the first and second magnetization fixed regions 11a and 11b are located, respectively. The magnetization liberalized region 13 overlaps with the reference layer 30 to interpose the spacer layer 20 therebetween. The magnetization of the first magnetization fixed region 11a and that of the second magnetization fixed region 11b are fixed in directions reverse (antiparallel) to each other. In the example illustrated in FIG. 2, the magnetization direction of the first magnetization fixed region 11a is fixed to +z direction by effect of the first magnetization fixed layer 41a while that of the second magnetization fixed region 11b is fixed to −z direction by effect of the second magnetization fixed layer 41b. The first and second magnetization fixed layers 41a and 41b are each a ferromagnetic film having perpendicular magnetic anisotropy, and are each a film having a higher coercive force than the magnetic memory layer 10.

The magnetization direction of the magnetization liberalized region 13 is reversible, and may become any one of +z direction and −z direction. Accordingly, in accordance with the magnetization direction of the magnetization liberalized region 13, a domain wall 12 (12a or 12b) is created in the magnetic memory layer 10. When the magnetization direction of the magnetization liberalized region 13 is +z direction in the example illustrated in FIG. 2, the domain wall 12b is created between the magnetization liberalized region 13 and the second magnetization fixed region 11b. On the other hand, when the magnetization direction of the magnetization liberalized region 13 is −z direction, the domain wall 12a is created between the magnetization liberalized region 13 and the first magnetization fixed region 11a. In other words, the magnetic memory layer 10 has at least one domain wall (12: 12a or 12b), and the position of the domain wall 12 corresponds to the magnetization direction of the magnetization liberalized region 13.

The spacer layer 20 is laid adjacently to the magnetic memory layer 10. The spacer layer 20 is laid, in particular, adjacently to at least the magnetization liberalized region 13 of the magnetic memory layer 10. This spacer layer 20 is made of a nonmagnetic body, and is preferably made of an insulator (such as alumina, i.e., aluminum oxide (Al—Ox), or magnesium oxide (MgO)).

The reference layer 30 is laid adjacently to the spacer layer 20, and at the side of the spacer 20 opposite to the magnetic memory layer-10-laid side of the spacer layer 20. In other words, the reference layer 30 is coupled through the spacer layer 20 with the magnetic memory layer 10 (magnetization liberalized region 13). This reference layer 30 is made of a ferromagnetic body, and the magnetization direction thereof is fixed to one direction. Preferably, in the same manner as the magnetic memory layer 10, the reference layer 30 is made of a ferromagnetic body having perpendicular magnetic anisotropy. In this case, the magnetization direction of the reference layer 30 is fixed to +z direction or −z direction. In the example illustrated in FIG. 2, the magnetization direction of the reference layer 30 is fixed to +z direction. However, the reference layer 30 may be made of a ferromagnetic body having in-plane magnetic anisotropy. In this case, the reference layer 30 is arranged not just above the magnetization liberalized region 13 but at a position shifted in any one of the in-plane directions from the just-above position (a position where the gravity center in the xy plane of the layer 30 is not consistent with that in the plane of the magnetization liberalized region 13). In order to make large the coercive force of the ferromagnetic body of the reference layer 30, an antiferromagnetic layer may be stacked thereon. The antiferromagnetic layer may be an antiferromagnetic layer made of a manganese alloy such as iron/manganese (FeMn), platinum/manganese (PtMn) or nickel/manganese (NiMn), or an antiferromagnetic layer made of an oxide such as cobalt oxide (CoO) or nickel oxide (NiO).

The above-mentioned magnetization liberalized region 13, spacer layer 20 and reference layer 30 form a magnetic tunnel junction (MTJ). In other words, the magnetization liberalized region 13, the spacer layer 20, and the reference layer 30 correspond to a free layer, a barrier layer, and a pin layer in the MTJ, respectively.

Electrode layers are electrically coupled with both ends of the magnetic memory layer 10, respectively. The two layers are laid, in particular, to be coupled with the first and second magnetization fixed regions 11a and 11b, respectively. These electrode layers are used to introduce a writing current to the magnetic memory layer 10. These electrode layers can be coupled through the first and second magnetization fixed layers 41a and 41b, respectively, with both the ends of the magnetic memory layer 10, respectively. In the example illustrated in FIG. 2, a first electrode layer 42a (as one of the electrode layers) is laid on the first magnetization fixed layer 41a while a second electrode layer 42b (as the other) is laid on the second magnetization fixed layer 41b. Another electrode layer is laid on the reference layer 30.

The reference layer 30 and the magnetic memory layer 10 are each a ferromagnetic film having perpendicular magnetic anisotropy. The direction of the magnetization of each of the magnetic memory layer 10 and the reference layer 30 is directed to the film thickness direction. The magnetic memory layer 10 and the reference layer 30 are each made of, for example, iron (Fe), cobalt (Co), nickel (Ni), or any alloy containing one or more of these metals. When the magnetic memory layer 10 and the reference layer 30 each contain Pt or Pd, the perpendicular magnetic anisotropy thereof can be stabilized. Besides the element(s), the following may be added thereto, thereby making it possible to cause the layer 10 or 30 to exhibit a desired magnetic property: B. C, N, O, Al, Si, P, Ti, V, Cr, Mn, Cu, Zn, Zr, Nb, Mo, Tc, Ru, Rh, Ag, Hf, Ta, W, Re, Os, Ir, Ay, Sm, and/or some other. Specific examples of the material usable in the magnetic memory layer 10 and the reference layer 30 include Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, and Sm—Co. By stacking a layer containing any one selected from Fe, Co and Ni onto another layer, the resultant stacked film can exhibit perpendicular magnetic anisotropy. Specific examples of the stacked film include respective stacked films of Co/Pd, Co/Pt, and Fe/Au.

Furthermore, the layer containing Fe, Co or Ni in such a stacked film may be a stacked film. In other words, this layer may be a layer in which the following first and second layers are stacked once or plural times: a first layer that is made of a single metal or alloy that contains at least one selected from Fe, Co and Ni, and is made of any one of the above-mentioned various materials; and a second layer that is made of a single metal or alloy that contains at least one selected from Fe, Co and Ni, is made of any one of the above-mentioned various materials, and is different from the first layer. By this structure, the stacked layer can be caused to exhibit perpendicular magnetic anisotropy. A specific example thereof is a stacked film of Co and Ni formed on a Pt film ([Co/Ni]n/Pt film).

The following will describe, about the example illustrated in FIG. 2, the memorization state of a data in the magnetoresistance effect element of the magnetic memory according to the first embodiment of the invention.

When the magnetization direction of the magnetization liberalized region 13 in the example in FIG. 2 is +z direction, the domain wall 12b is created at the boundary between the magnetization liberalized region 13 and the second magnetization fixed region 11b. The magnetization direction of the magnetization liberalized region 13 is parallel to that of the reference layer 30. Accordingly, the resistance value of the MTJ becomes relatively small. This magnetization state is caused to correspond to, for example, the memorization state of data "0". On the other hand, when the magnetization direction of the magnetization liberalized region 13 in FIG. 2 is −z direction, the domain wall 12a is created at the boundary between the magnetization liberalized region 13 and the first magnetization fixed region 11b. The magnetization direction of the magnetization liberalized region 13 is antiparallel to that of the reference layer 30. Accordingly, the resistance value of the MTJ becomes relatively large. This magnetization state is caused to correspond to the memorization state of data "1". In this way, two memorization states are realized in accordance with the magnetization state of the magnetization liberalized region 13, that is, the position of the domain wall 12 in the magnetic memory layer 10. The magnetization liberalized region 13 memorizes a data, correspondingly to the position of the domain wall 12 thereof.

With reference to FIG. 2, the following will describe a method for writing a data into the magnetoresistance effect element in the first embodiment.

When data "1" (the magnetization direction of the magnetization liberalized region 13 and that of the reference layer 30 are antiparallel to each other) is written into the magnetic memory layer in a data "0" state (they are parallel to each other), a writing current IW is caused to flow from the first magnetization fixed region 11a to the second magnetization fixed region 11b. Conductive electrons flow from the second magnetization fixed region 11b to the first magnetization fixed region 11a. At this time, spin transfer torque (STT) acts onto the domain wall 12b positioned near the boundary between the second magnetization fixed region 11b and the magnetization liberalized region 13, so that the domain wall 12b is moved toward the first magnetization fixed region 11a. In other words, current driven domain wall motion is caused. The writing current (density) is made smaller in the first magnetization fixed region 11a than the boundary between the first magnetization fixed region 11a and the magnetization liberalized region 13, so that the movement of the domain wall 12 is stopped near the boundary. In this way, the domain wall 12b is moved near the boundary between the first magnetization fixed region 11a and the magnetization liberalized region 13, so that the writing of data "1" is realized.

When data "0" (the magnetization direction of the magnetization liberalized region 13 and that of the reference layer 30 are parallel to each other) is written into the magnetic memory layer in the data "1" state (they are antiparallel to each other), a writing current IW is caused to flow from the second magnetization fixed region 11b to the first magnetization fixed region 11a. Conductive electrons flow from the first magnetization fixed region 11a to the second magnetization fixed region 11b. At this time, spin transfer torque (STT) acts onto the domain wall 12a positioned near the boundary between the first magnetization fixed region 11a and the magnetization liberalized region 13, so that the domain wall 12a is moved toward the second magnetization fixed region 11b. In other words, current driven domain wall motion is caused. The writing current (density) is made smaller in the second magnetization fixed region 11b than the boundary between the second magnetization fixed region 11b and the magnetization liberalized region 13, so that the movement of the domain wall 12 is stopped near the boundary. In this way, the domain wall 12a is moved near the boundary between the second magnetization fixed region 11b and the magnetization liberalized region 13, so that the writing of data "0" is realized.

When data "0" is written in the magnetic memory layer in any data "0" state, as well as when data "1" is written in the magnetic memory layer in any data "1" state, the state is not changed. In conclusion, overwriting can be attained.

With reference to FIG. 2, the following will describe a method for reading a data in the magnetoresistance effect element in the first embodiment of the invention.

In the embodiment, any data is read out by use of tunneling magnetoresistive effect (TMR effect). For this purpose, a reading-out current IR is caused to flow into the MTJ (the magnetization liberalized region 13, the spacer layer 20, and the reference layer 30) along an MTJ-penetrating direction. The reading-out current direction is any one of the two MTJ-penetrating directions. In this case, when the magnetoresistance effect element 70 is in a data "0" state, the resistance value of the MTJ becomes relatively small. When the magnetoresistance effect element 70 is in a data "1" state, the resistance value of the MTJ becomes relatively large. Accordingly, when this resistance value is detected, the data can be read out.

Figure 3A:
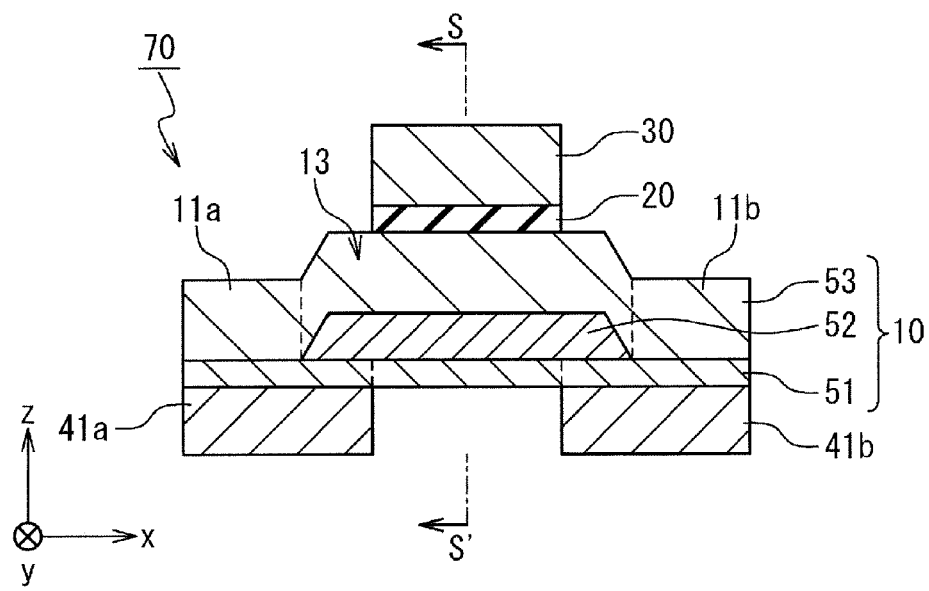
FIG. 3A is a side face view illustrating a structural example of a magnetoresistance effect element of the magnetic memory according to the first embodiment.
Figure 3B:
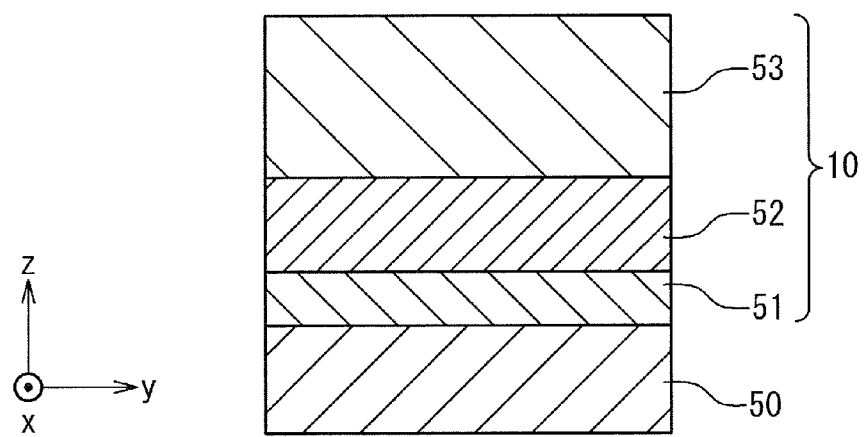
FIG. 3B is a sectional view illustrating a magnetic memory layer of the magnetoresistance effect element of the structural example.

The following will further describe, in detail, the structure of the magnetic memory layer 10 of the magnetoresistance effect element 70 in the first embodiment of the invention. FIG. 3A is a side face view illustrating a structural example of the magnetoresistance effect element in the first embodiment. FIG. 3B is a sectional view illustrating a magnetic memory layer 10 of the magnetoresistance effect element of this structural example, and is specifically a sectional view of the magnetic memory layer 10 taken on line SS' in FIG. 3A.

In the structural example illustrated in FIGS. 3A and 3B, a magnetoresistance effect element 70 has, besides the magnetic memory layer 10, a spacer layer 20 and a reference layer 30, and further has a first magnetization fixed layer 41a and a second magnetization fixed layer 41b. The magnetic memory layer 10 includes an underlying layer 51, a middle layer 52, and a data memorizing layer 53.

The data memorizing layer 53 has perpendicular magnetic anisotropy, and therein the following regions are formed: a first magnetization fixed region 11a; a second magnetization fixed region 11b; and a magnetization liberalized region 13. In short, the data memorizing layer 53 has a function of memorizing data. The middle layer 52 and the underlying layer 51 are laid under the data memorizing layer 53 to have a function of causing the data memorizing layer 53 to have a desired magnetic property. In the embodiment, the magnetic property of the data memorizing layer 53 is affected by materials of the underlying body (including the underlying layer and the middle layer 52). In light of this matter, the effect of the materials of the underlying body has been investigated in detail, in particular, about a case where the crystal orientation of the data memorizing layer 53 is varied in accordance with the materials of the underlying body, and the magnitude of the perpendicular magnetic anisotropy is also fluctuated accordingly. Furthermore, a change in the perpendicular magnetic anisotropy that depends on temperature for subsequent thermal treatment is also varied in accordance with the materials of the underlying body. It is therefore important to select the underlying body materials appropriately.

About the underlying layer 51, both end regions (in x direction) of the bottom thereof (in −z direction) come into contact with the respective tops of the first magnetization fixed layer 41a and the second magnetization fixed layer 41b. The underlying layer 51 is made of a magnetic body, and is preferably made of a ferromagnetic body. As will detailed later, the matter that the underlying layer 51 is made of ferromagnetic body is favorable for assisting magnetic coupling between the first and second magnetization fixed layer 41a or 41, and the data memorizing layer 53.

The underlying layer preferably has an amorphous or microcrystalline structure since the upper surface of the underlying layer 51 can be made high in flatness. The microcrystalline structure contains a crystal phase having a crystal having a grain diameter of several nanometers to about 20 nm. The structure may be a mixed phase of the crystal phase and an amorphous phase. The matter that the upper surface of the underlying layer 51 is flat is favorable for rendering the data memorizing layer 53 stacked over the underlying layer to interpose the middle layer 52 therebetween a film having a desired crystallinity. When the data memorizing layer 53 is, for example, a [Co/Ni]n/Pt film, the matter is favorable for causing Co/Ni to orient to fcc (111), which can attain a high perpendicular magnetic anisotropy.

The material of the underlying layer 51 contains, as a main component, at least one of Ni, Fe and Co, and further contains at least one nonmagnetic element selected from the group consisting of Zr, Hf, Ti, V, Nb, Ta, W, B and N. The main component means, out of contained elements, a component the content by percentage of which is the largest. Examples of the material of the underlying layer 51 include NiFeZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, and CoTi.

By making the middle layer 52 thick, the effect based on the crystallinity of the underlying layer 51 can be removed to some degree. Thus, when the middle layer 52 is made thick, the underlying layer 51 may have a polycrystal structure. In order to enhance the magnetic coupling between the magnetization fixed layer 41a and the magnetization fixed region 11a, as well as between the layer 41b and the region 11b, it is preferred that the underlying layer 51 has perpendicular magnetic anisotropy. Particularly preferred examples of the material of the underlying layer 51 satisfying this requirement include CoCrPt, CoCrTa, CoCrTaPt, and CoCr based alloys; and a mixture composed of CoCr based alloy, and $SiO_2$, $TiO_2$ or some other.

The middle layer 52 is laid on the top (in +z direction) of the underlying layer 51 and at a substantially central region (in x direction) of the layer 51. In other words, the middle layer 52 is laid under the magnetization liberalized region 13 but is not laid under the first or second magnetization fixed region 11a or 11b. The middle layer 52 is made of a nonmagnetic body. In order to enhance the perpendicular magnetic anisotropy of the magnetization liberalized region 13 stacked on the middle layer 52, it is preferred that the middle layer 52 is made of a material small in surface energy to undergo crystal orientation easily. The middle layer 52 is, for example, a Ta film. When the middle layer 52 is a Ta film, the film thickness thereof is preferably 2.0 nm or more, as will be detailed later. If the film thickness is smaller than 2.0 nm, the film thickness of the completed Ta film is largely varied inside the wafer, so that the property of the magnetization liberalized region 13 may not become even. Moreover, according to this structure of the magnetic memory layer 10, the domain wall present at one of the ends of the magnetization liberalized region 13 is not easily moved by a step of the data memorizing layer 53 that is based on any edge (in x direction) of the middle layer 52. Thus, in order to make the effect given by the step small, it is preferred to make the edge (in x direction) of the middle layer 52 into a tapered form.

By the laying of the middle layer 52, the magnetic coupling between the magnetization liberalized region 13 and the underlying layer 51 can be broken. If the magnetization liberalized region 13 is magnetically coupled with the underlying layer 51, it may unfavorably become difficult to attain the domain wall motion. The magnetization fixed regions 11a and 11b do not have the middle layer 52 just underneath these regions, so that the regions come into contact with the underlying layer 51. Thus, the magnetizations of the magnetization fixed regions 11a and 11b are easily fixed by effect of the underlying layer 51, and the magnetization fixed layers 41a and 41b. As described herein, when the magnetic memory a structure having the underlying layer 51, it is preferred that the middle layer 52 is present just underneath the magnetization liberalized region 13, and is neither present just underneath the magnetization fixed region 11a nor 11b.

The data memorizing layer 53 is stacked to cover the middle layer 52, and the underlying layer 51 regions at both sides (in x direction) of the layer 52. The data memorizing layer 53 is made of a ferromagnetic body having perpendicular magnetic anisotropy. The first magnetization fixed region 11a, the second magnetization fixed region 11b, and the magnetization liberalized region 13 of the magnetic memory layer 10 are formed in this data memorizing layer 53. In other words, the data memorizing layer 53 is a region where the domain wall is created, and a data is memorized in accordance with the magnetization direction of the magnetization liberalized region 13, or the position of the domain wall. The data memorizing layer 53 may be made of one or more of the above-mentioned ferromagnetic materials suitable for the magnetic memory layer 10, these materials having perpendicular magnetic anisotropy. In this case, each of the first and second magnetization fixed regions 11a and 11b does not have, at the just-underneath side thereof (at −z side) the middle layer 52, and the region comes into contact with the underlying layer 51 at the side (at −z side). The magnetization liberalized region 13 has, at the just-underneath side thereof (at −z side), the middle layer 53 to come into contact with the middle layer 53 at the just-underneath side.

A substrate part 50 (mainly, an underneath side (−z side) part below an underlying-layer-51-portion underneath (or toward −z direction from) the magnetization liberalized region 13) includes a semiconductor substrate, elements (such as the select transistors Tra and Trb) formed thereon and buried in an interlayer dielectric (made of, for example, $SiO_2$ or $SiNx$), and interconnects (such as the word line WL, and bit lines BL and $\overline{BL}$).

Figure 3C:
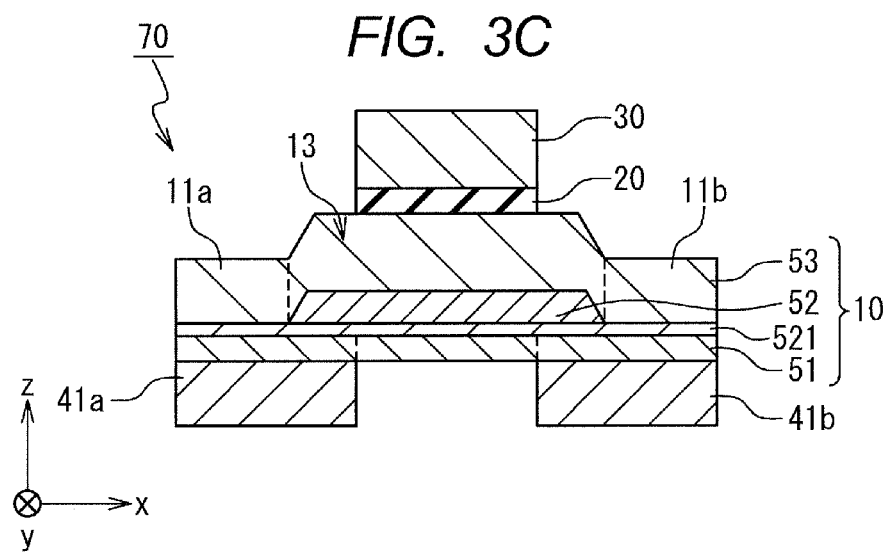
FIG. 3C is a side surface view illustrating another structural example of the magnetoresistance effect element of the magnetic memory according to the first embodiment.

For the convenience of the production of the magnetoresistance effect element 70, the present embodiment may further have a thin protective layer between the middle layer 52 and the underlying layer 51. FIG. 3C is a side surface view illustrating another structural example of the magnetoresistance effect element according to the first embodiment of the invention. A magnetoresistance effect element 70 of this example is different from the element illustrated in FIG. 3A in that the present element 70 has, on an underlying layer 51 thereof, a protective layer 521 which is a thin film. This protective film 521 is used as an etching stopper film when a middle layer 52 is worked by etching. The protective film 521 is an electroconductive thin film of a nonmagnetic body. Thus, the protective film 521 does not produce any effect onto the film quality of the middle layer 52 or a data memorizing layer 53, and further does not produce any effect onto magnetic coupling between the data memorizing layer 53, and the underlying layer 51 or a magnetic memory layer 41a or 41b. The protective film 521 is, for example, a ruthenium (Ru) film.

Figure 4:
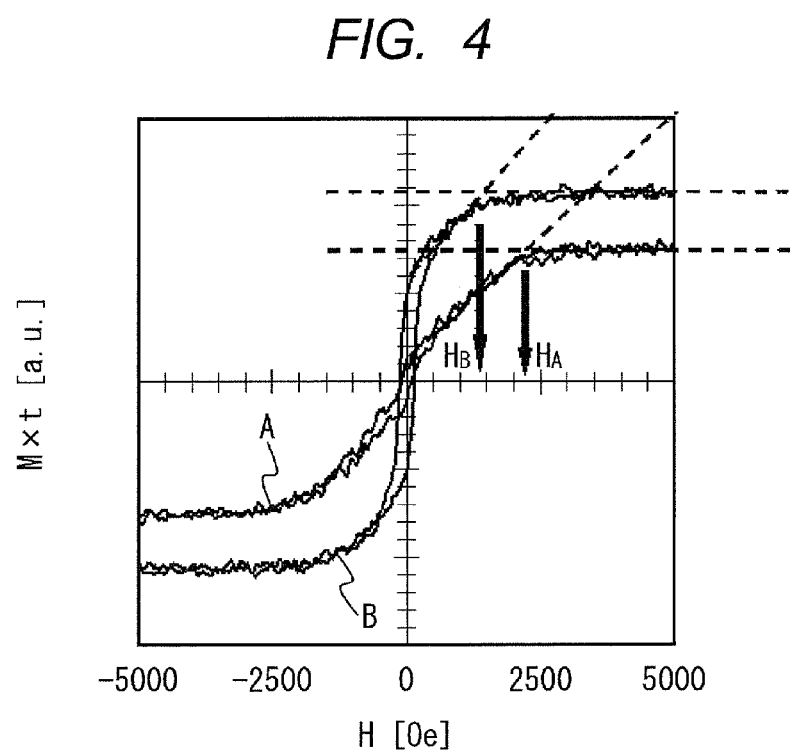
FIG. 4 is a graph showing an example illustrating a magnetization curve when an external magnetic field is applied to each of two different data memorizing layers.

Hereinafter, working examples of the magnetoresistance effect element according to the first embodiment of the invention will be described with a comparison with comparative examples. In these examples, in connection with the magnetic property of a data memorizing layer of any magnetoresistance effect element, the saturation magnetic field thereof is defined as an index of the magnitude of the perpendicular magnetic anisotropy thereof. The saturation magnetic field is used to make, for evaluation, the comparison. FIG. 4 is a graph showing an example of a magnetization curve generated when an external magnetic field is applied to each of two data memorizing layers. The vertical axis represents a value (unit: selected at will) of "the (generated) magnetization M×the film thickness t", and the transverse axis represents the applied magnetic field H (unit: Oe). The saturation magnetic field Hs as the index of the magnitude of the perpendicular magnetic anisotropy corresponds to the magnitude of the external magnetic field when the external magnetic field H is applied to the magnetic memory layer in parallel to the in-plane direction thereof, whereby the direction of the magnetization M is made consistent with that of the external magnetic field H. In the figure, about a magnetization curve A, $H_A$ corresponds to the saturation magnetic field Hs; and about a magnetization curve B, $H_B$ corresponds thereto. Hereinafter, the comparative examples and the working examples will be described.

COMPARATIVE EXAMPLE 1

Figure 5A:
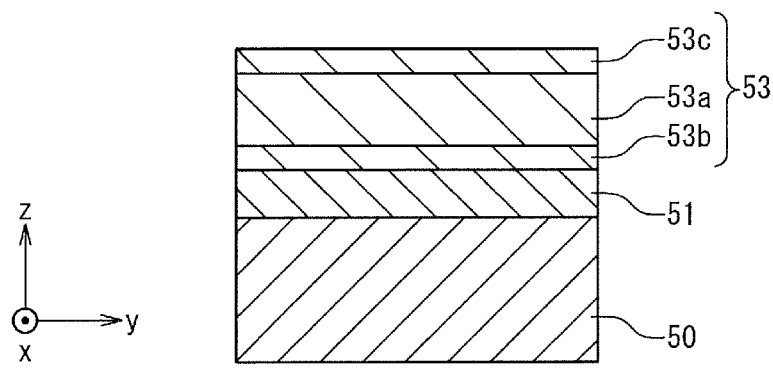
FIG. 5A is a sectional view of the structure of a magnetoresistance effect element of Comparative Example 1.
Figure 5B:
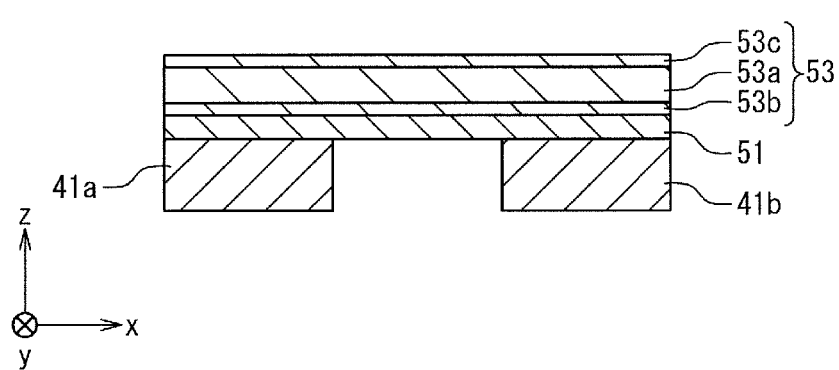
FIG. 5B is a side surface view illustrating this structure.

Magnetic Property when a NiFeZr Film is Used as the Same Underlying Layer as in FIG. 3, and the Same Middle Layer as Therein is not Inserted Between the Layers Concerned FIGS. 5A and 5B are a sectional view and a side surface view illustrating the structure of a magnetoresistance effect element of Comparative Example 1, respectively. However, spacer layer 20 and a reference layer 30 are omitted in the views. For a substrate part 50, $SiO_2$ was used as an example. The material object used as an example for a data memorizing layer 53 was a [Co/Ni]n/Pt film, in which a stacked film of Co and Ni, i.e., a [Co/Ni] n film 53a was stacked on a Pt film 53b, this [Co/Ni] n/Pt film being a material object suitable for domain wall motion in any material having perpendicular magnetic anisotropy. Furthermore, a Pt film 53c was stacked thereon as a cap layer.

The [Co/Ni]n/Pt film becomes high in perpendicular magnetic anisotropy when the Co/Ni layers are oriented to fcc (111). However, the crystal orientation thereof is varied in accordance with the material of an underlying layer thereof, so that the magnitude of the perpendicular magnetic anisotropy is fluctuated. In Comparative Example 1, without using any middle layer 52, a data memorizing layer 53 was stacked directly onto an underlying layer 51. In other words, a magnetic memory layer 10 was composed of the underlying layer 51 and the data memorizing layer 53. The used underlying layer 51 was a NiFeZr film. The film thickness thereof was set to 2.0 nm. In order to evaluate an original magnetic property of the resultant film, the film was not patterned. Specifically, the magnetic property of the film of the data memorizing layer 53 was evaluated in the state that the sample of Comparative Example 1 was as-deposited films (Pt/[Co/Ni]n/Pt film 53/NiFeZr film 51). For the magnetic property evaluation, a vibrating sample magnetometer was used (hereinafter, the same).

Figure 6A:
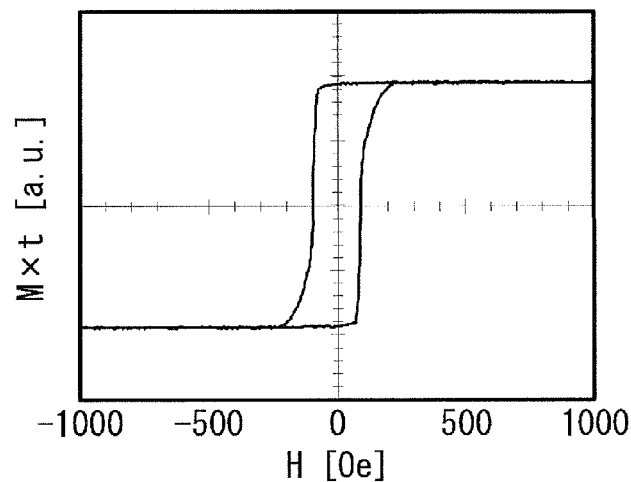
FIG. 6A is a graph showing an example illustrating a magnetization curve when a vertical external magnetic field was applied to a film of a data memorizing layer having the structure illustrated in FIGS. 5A and 5B.
Figure 6B:
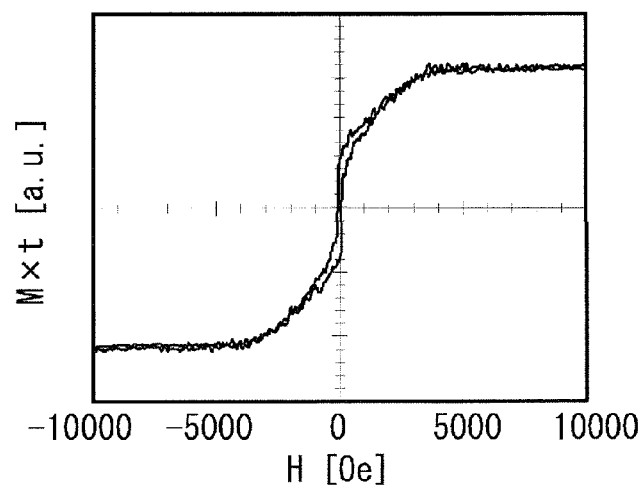
FIG. 6B is a graph showing an example of a magnetization curve when an in-plane direction external magnetic field was applied to the same film as described just above.

Firstly, a description is made about the magnetic property of the film of the data memorizing layer 53 not subjected to any treatment after the film was formed. FIGS. 6A and 6B are each a graph showing an example of a magnetization curve when an external magnetic field was applied to the film of the data memorizing layer having the structure illustrated in FIGS. 5A and 5B. The vertical axis represents a value (unit: selected at will) of "the magnetization M×the film thickness t", and the transverse axis represents the applied magnetic field H (unit: Oe). FIG. 6A shows a magnetization curve when the external magnetic field H was applied to the film perpendicularly to the film plane. FIG. 6B shows a magnetization curve when the external magnetic field H was applied thereto in parallel to the in-plane direction of the film. It is understood that the magnetization curve when the perpendicular magnetic field is applied (perpendicular loop: FIG. 6A) is standing, and the hysteresis thereof is large while the magnetization curve when the in-plane magnetic field is applied (in-plane loop: FIG. 6B) is lying. For this matter, the film of this data memorizing layer 53 has perpendicular magnetic anisotropy. In other words, a [Co/Ni]n/Pt film on a NiFeZr film has perpendicular magnetic anisotropy, and has a possibility suitable for domain wall motion.

Figure 7A:
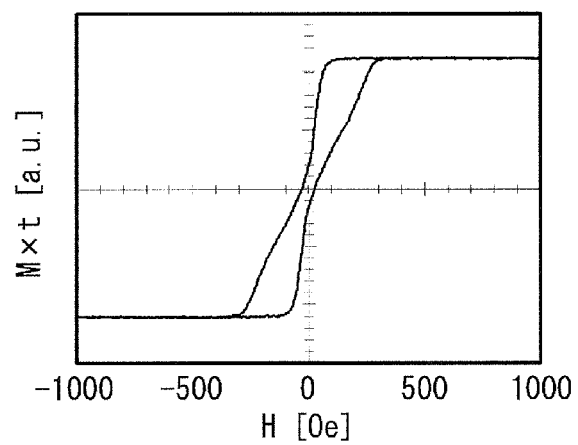
FIG. 7A is a graph showing an example of a magnetization curve when a vertical external magnetic field was applied to the same film as described just above after the film was subjected to thermal treatment.
Figure 7B:
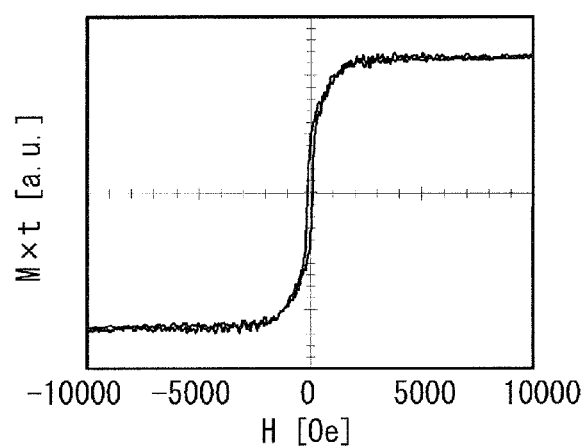
FIG. 7B is a graph showing an example of a magnetization curve when an in-plane direction external magnetic field was applied to the same film as described just above after the film was subjected to thermal treatment.

Secondary, a description is made about the magnetic property of the film of the data memorizing layer 53 after the magnetic, memory layer 10 was subjected to thermal treatment in an inert gas at 300° C. for 2 hours. FIGS. 7A and 7B are each a graph showing an example of a magnetization curve when an external magnetic field was applied to the film of the data memorizing layer having the structure illustrated in FIGS. 5A and 5B after the film was subjected to the thermal treatment. The vertical axis represents a value (unit: selected at will) of "the magnetization M×the film thickness t", and the transverse axis represents the applied magnetic field H (unit: Oe). FIG. 7A shows a magnetization curve when the external magnetic field H was applied to the film perpendicularly to the film plane (perpendicular loop). FIG. 7B shows a magnetization curve when the external magnetic field H was applied thereto in parallel to the in-plane direction of the film (in-plane loop). It is understood from a comparison with FIGS. 6A and 6B that the perpendicular loop (FIG. 7A) leans slightly to be slanting, and the in-plane loop (FIG. 7B) further rises up so that the inclination thereof turns steep. This matter demonstrates that this film of the data memorizing layer 53 is declined in perpendicular magnetic anisotropy by the 300° C.-thermal treatment. According to a further comparison between FIGS. 6A and 7A, the value represented by the vertical axis of the graph in FIG. 7A, that is, the product of the saturation magnetization and the film thickness (Ms×t) is larger. This is based on a matter that the NiFeZr film having in-plane magnetic anisotropy is magnetically coupled with the [Co/Ni]n/Pt film by the 300° C. thermal treatment so that the magnetization of the magnetic memory layer 10 is increased. This would be also based on a matter that the perpendicular magnetic anisotropy is declined by the magnetic coupling.

COMPARATIVE EXAMPLE 2

Fear about the Magnetic Coupling of a Ta Underlying Layer: Magnetic Property when a Ta Film is Used as the Same Underlying Layer as in FIG. 3, and the Same Middle Layer as Therein is not Inserted Between the Layers Concerned Comparative Example 2 was identical with Comparative Example 1 in the structure of the magnetic memory layer 10, but was different from Comparative Example 1 (underlying layer 51: NiFeZr film) in that the used underlying layer 51 was a Ta film. In this example, the Co/Ni layers were oriented to fcc (111) (to have perpendicular magnetic anisotropy); thus, when the Ta film was used, it was necessary that the film thickness was 4.0 nm or more. This film thickness was about two times larger than the film thickness (2.0 nm) of the NiFeZr film in Comparative Example 1 to be very large. As described herein, the film thickness of the Ta film, which was a nonmagnetic body film, was large, so that it was difficult in Comparative Example 2 that the first or second magnetic memory layer 41a or 41b was magnetically coupled with the data memorizing layer 53. Thus, in the first and second magnetization fixed regions 11a and 11b, the magnetizations thereof are not fixed so that no data can be memorized in the data memorizing layer 53.

In light of Comparative Examples 1 and 2, working examples as described below have been found out, considering a matter that the NiFeZr film and the [Co/Ni]n/Pt film should not be magnetically coupled unnecessarily with each other after subjected to the thermal treatment, a matter that the magnetic coupling should not be broken between the first or second magnetization fixed layer 41a or 41b, and the data memorizing layer 53, and other matters.

EXAMPLE 1

Figure 8A:
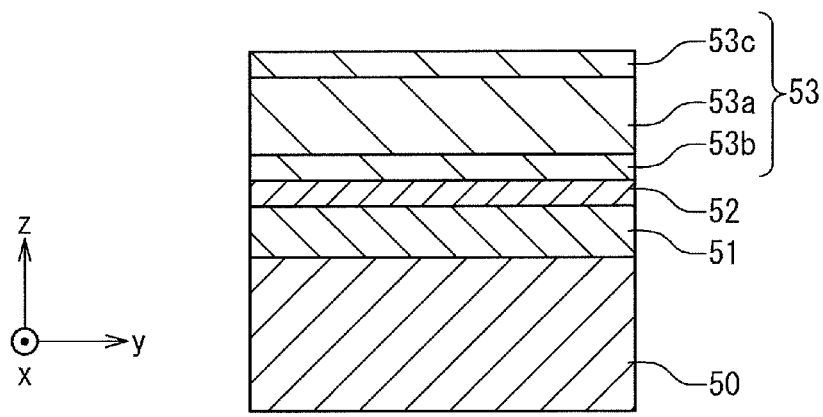
FIG. 8A is a sectional view illustrating the structure of a magnetoresistance effect element of Example 1.
Figure 8B:
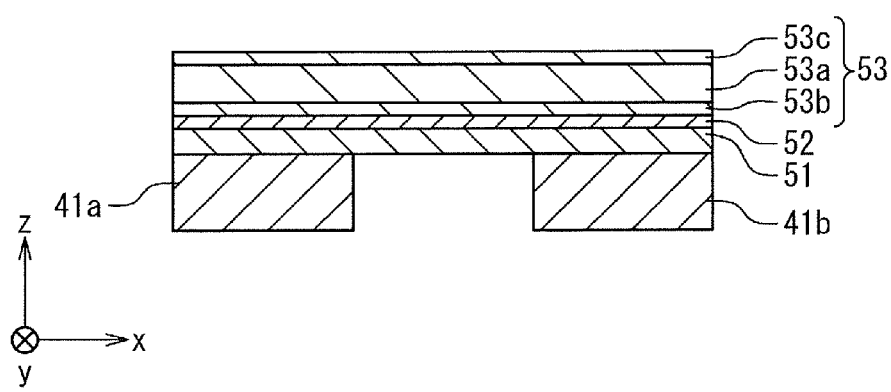
FIG. 8B is a side view illustrating the structure described just above.

Magnetic Property when a NiFeZr Film is Used as the Same Underlying Layer as in FIGS. 3, and a Ta Film as the Same Middle Layer as Therein is Inserted Between the Layers Concerned FIGS. 8A and 8B are a sectional view and a side surface view illustrating the structure of a magnetoresistance effect element of Example 1, respectively. However, a spacer layer 20 and a reference layer 30 are omitted in the views. As illustrated in FIG. 8B, a middle layer 52 was laid on the whole of the upper surface of an underlying layer 51 in order to evaluate an original magnetic property of a film to be obtained. For a substrate part 50, $SiO_2$ was used as an example. In the same manner as in Comparative Example 1, the material object used for a data memorizing layer 53 was a [Co/Ni] n/Pt film, in which a stacked film of Co and Ni, i.e., a [Co/Ni]n film 53a was stacked on a Pt film 53b, this [Co/Ni]n/Pt film being a material object suitable for domain wall motion in any material having perpendicular magnetic anisotropy. Furthermore, in this working example also, a Pt film 53c was stacked thereon as a cap layer.

In Example 1, the middle layer 52 was inserted between the underlying layer (NiFeZr film) 51 and the data memorizing layer ([Co/Ni]n/Pt film) 53 not to couple the two layers magnetically with each other. In other words, a magnetic memory layer 10 was composed of the underlying layer 51, the middle layer 52, and the data memorizing layer 53. The middle layer 52 used was a Ta film. The film thickness was 2.0 nm. The sample of Example 1 was subjected to thermal treatment in an inert gas at 300° C. for 2 hours in the state of "Pt/[Co/Ni]n/Pt film 53/Ta film 52/NiFeZr film 51", in which the individual layers were formed.

Magnetic Property: A description is made about the magnetic property of the data memorizing layer after the 300° C. thermal treatment in the inert gas for 2 hours.

Figure 9A:
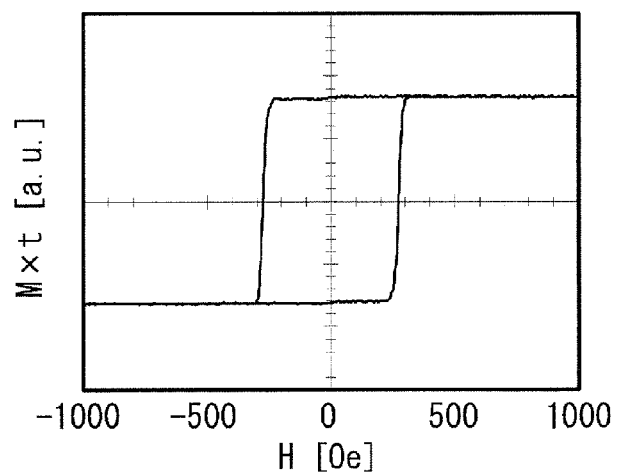
FIG. 9A is a graph showing an example of a magnetization curve when a vertical external magnetic field was applied to a film of a data memorizing layer illustrated in FIGS. 8A and 8B.
Figure 9B:
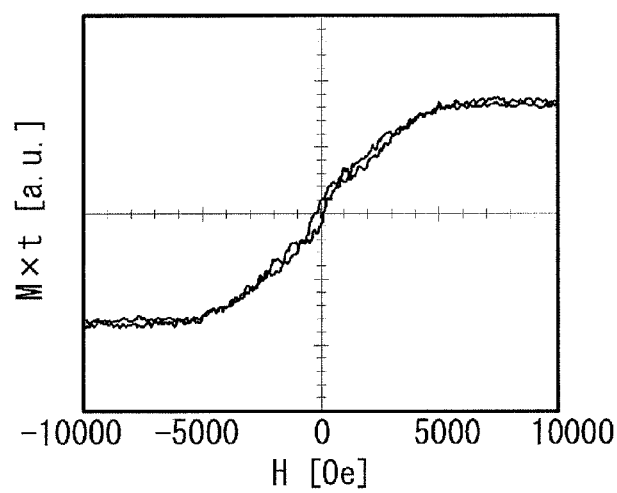
FIG. 9B is a graph showing an example of a magnetization curve when an in-plane direction magnetic field was applied to the film described just above.

FIGS. 9A and 9B are each a graph showing an example of a magnetization curve when an external magnetic field was applied to the film of the data memorizing layer illustrated in FIGS. 8A and 8B. The vertical axis represents a value (unit: selected at will) of "the magnetization M×the film thickness t", and the transverse axis represents the applied magnetic field H (unit: Oe). FIG. 9A shows a magnetization curve when the external magnetic field H was applied to the film perpendicularly to the film plane (perpendicular loop). FIG. 9B shows a magnetization curve when the external magnetic field H was applied thereto in parallel to the in-plane direction of the film (in-plane loop). It is understood from a comparison between these figures and FIGS. 6A, 6B, 7A and 7B that the in-plane loop in FIG. 9 is lying so that Example 1 is large in perpendicular magnetic anisotropy even after the 350° C. thermal treatment. It is also understood from a comparison between FIG. 9B and FIG. 7B that in FIG. 9B, the saturation magnetization Hs (see FIG. 4) is higher. In other words, in Example 1 shown in FIG. 9B, higher is the magnetic field necessary for making the direction of the magnetization consistent with the direction of the external magnetic field. It is therefore understood that the magnetic memory layer 10 illustrated in FIGS. 8A and 8B, in which the Ta film as the middle layer 52 is inserted, is larger in perpendicular magnetic anisotropy of the data memorizing layer 53 than the magnetic memory layer 10 illustrated in FIGS. 5A and 5B, which has no middle layer 52.

The Ta film as the middle layer 52 was made thick to have a film thickness of 5 nm. The thus-obtained sample of Example 2 was then evaluated in the same way as described above. As a result, this sample was able to gain a saturation magnetic field Hs value equivalent to that of the sample of Example 1, in which the film thickness of the Ta film was 2 nm. In other words, it was verified that even by making the film thickness of the Ta film as the middle layer 52 larger than 2 nm, the saturation magnetic field Hs is not declined.

As described above, it is understood that by the insertion of the middle layer 52 (such as a Ta film), the magnetic memory layer 10 in FIGS. 8A and 8B has a higher perpendicular magnetic anisotropy than any magnetic memory layer which does not have the middle layer 52 (Ta film thickness: 0 nm) even after subjected to thermal treatment at a high temperature of 350° C. This would be because the Ta film (middle layer 52) restrains magnetic coupling between the NiFeZr film (underlying layer 51), which has in-plane magnetic anisotropy, and the [Co/Ni]n/Pt film (data memorizing layer 53).

As shown by the results of Comparative Examples 1 and 2, and Example 1 described above, a Ta film, which is the middle layer 52, is inserted between the underlying layer 51 and the magnetization liberalized region 13 to have a film thickness of 2.0 nm or more, thereby making it possible to enhance the perpendicular magnetic anisotropy of the data memorizing layer 53, and the suitability thereof for domain wall motion. As illustrated in FIG. 3A or 3C, the magnetic memory which is an actual device does not have the middle layer 52 between the underlying layer 51, and the first nor second magnetization fixed region 11a nor 11b. For this reason, the middle layer 52 in the actual device does not produce any bad effect onto the magnetic coupling between the first or second magnetization fixed layer 41a or 41b, and the first or second magnetization fixed region 11a or 11b of the data memorizing layer 53, so that the data memorizing layer 53 can be made strong against thermal treatment. As a result, a magnetic memory can be obtained in which its data memorizing layer 53 has a strong perpendicular magnetic anisotropy even after the manufacturing method of the magnetic memory is finished.

Second Embodiment

Figure 10:
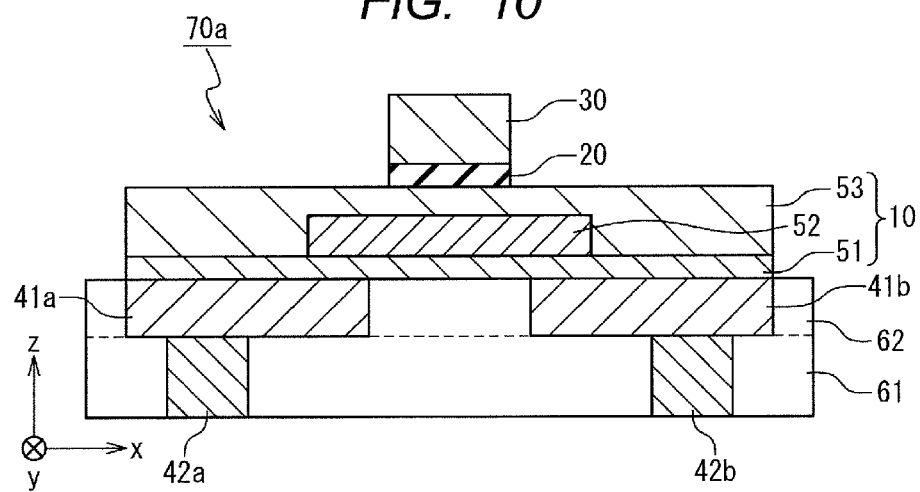
FIG. 10 is a side face view illustrating a structural example of a magnetoresistance effect element of a magnetic memory according to a second embodiment of the invention.

Hereinafter, a description will be made about a magnetic memory according to a second embodiment of the invention, and a manufacturing method thereof with reference to the remains of the attached drawings. The manufacturing method of the present embodiment can be applied to the production of the first embodiment. FIG. 10 is a side surface view illustrating a structural example of a magnetoresistance effect element of the magnetic memory according to the second embodiment of the invention. As compared with the magnetoresistance effect element 70 (illustrated in, for example, FIG. 3A) in the first embodiment, a magnetoresistance effect element 70a of this structural example is different in that edges of a middle layer are not worked into any tapered form. However, this difference depends on conditions for the etching (concerned); thus, respective manufacturing methods of the two are not different very much from each other. Hereinafter, the magnetoresistance effect element 70a will be described.

The magnetoresistance effect element 70a has, a magnetic memory layer 10, a spacer layer 20, and a reference layer 30, and further has a first magnetization fixed layer 41a, and a second magnetization fixed layer 41b. The magnetic memory layer 10 includes an underlying layer 51, a middle layer 52, and a data memorizing layer 53. These members, together with the respective structures of the magnetic memory and magnetic memory cells 80, are equivalent to those of the magnetoresistance effect element 70 of the first embodiment. Thus, description thereof is omitted.

Figure 11A:
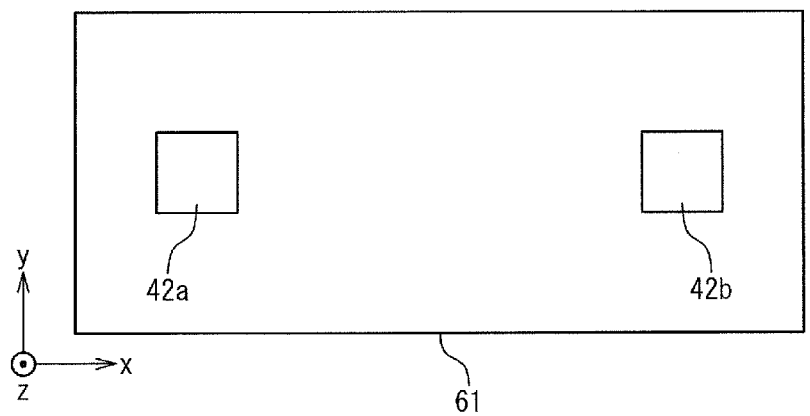
FIG. 11A is a plane view illustrating a step in a manufacturing method of the magnetic memory according to the second embodiment.

The following will describe the manufacturing method of the magnetic memory according to the present embodiment. FIGS. 11A, 11B and 11C are a plan view, an xz sectional view, and a yz sectional view, respectively, that illustrate a step in the manufacturing method of the magnetic memory according to the second embodiment of the invention; FIGS. 12A, 12B and 12C to FIGS. 18A, 18B, and 18C are also the same. In these figures is shown a method for manufacturing a partial region of the magnetoresistance effect element. The region is composed of first and second electrode layers 42a and 42b (Cu contact vias), and layers above the layers 42a and 42b. Illustration of a CMOS substrate and a Cu interconnect layer is omitted.

First, electronic elements such as CMOSes, and interconnects, such as the Cu interconnect (layer), are formed in/on an original semiconductor substrate. These formed members are covered with an interlayer dielectric 61 (this step is not illustrated). Subsequently, as illustrated in FIGS. 11A, 11B and 11C, Cu contact vias as the first and second electrode layer 42a and 42b are formed to be caused to penetrate the interlayer dielectric 61 and be coupled with other interconnects. In the present embodiment, the first and second electrode layers 42a and 42b are each in a rectangular parallelepiped form; however, the layers may each be in a cylindrical form in the same manner as in the first embodiment.

Next, as illustrated in FIGS. 12A, 12B and 12C, a film for a first magnetic memory layer 41a is deposited on the entire upper surface of the substrate by sputtering. The film is patterned into the form of the first magnetization fixed layer 41a at a predetermined position through a photoresist (PR) step and an etching step. In this way, the first magnetization fixed layer 41a is formed on the first electrode layer 42a. Subsequently, a film for a second magnetic memory layer 41b is deposited by sputtering. The film is patterned into the form of the second magnetization fixed layer 41b at a predetermined position through a PR step and an etching step. In this way, the second magnetization fixed layer 41b is formed on the second electrode layer 42b. In order to make the initialization of the magnetic memory cells easy at this time, films different from each other in magnetic property are used as the first and second magnetization fixed layers 41a and 41b.

Figure 13B:
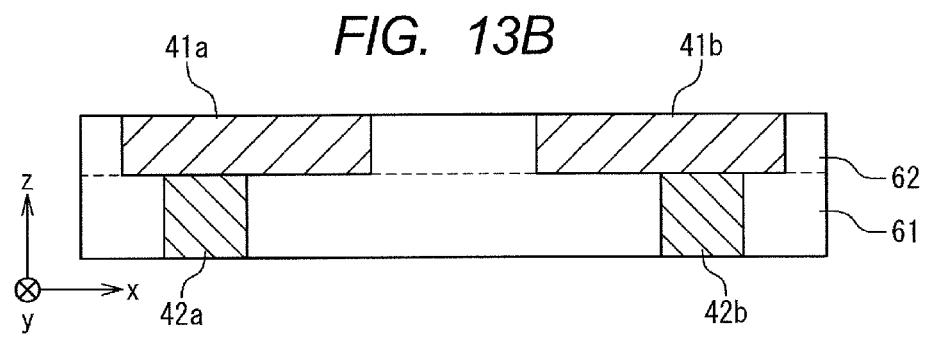
FIG. 13B is an xz sectional view illustrating this step.
Figure 13C:
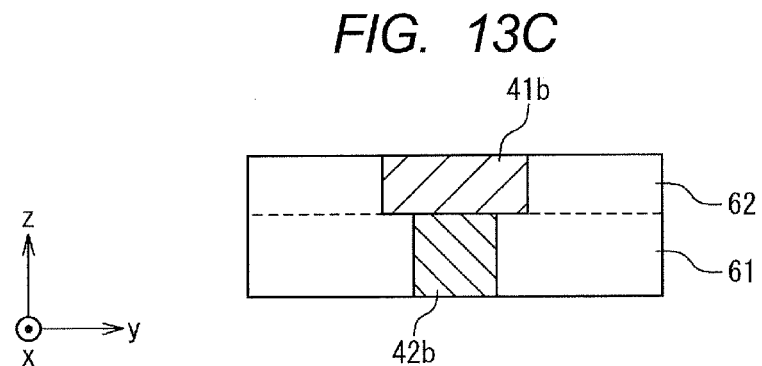
FIG. 13C is a yz sectional view illustrating this step.

Thereafter, as illustrated in FIGS. 13A, 13B and 13C, an interlayer dielectric 62 is formed over the entire upper surface of the substrate, and is made flat by chemical mechanical polishing (CMP) to make respective heads of the first and second magnetization fixed layers 41a and 41b uncovered.

Figure 14A:
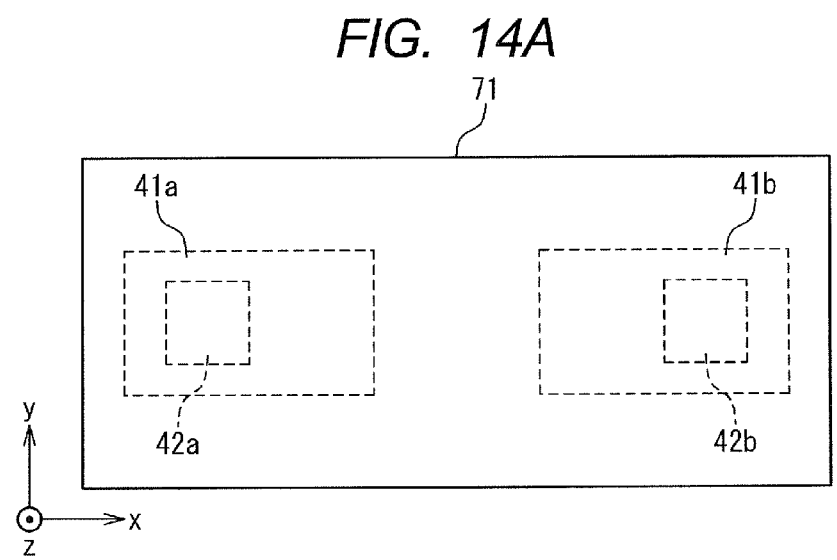
FIG. 14A is a plane view illustrating a step in the manufacturing method.
Figure 14B:
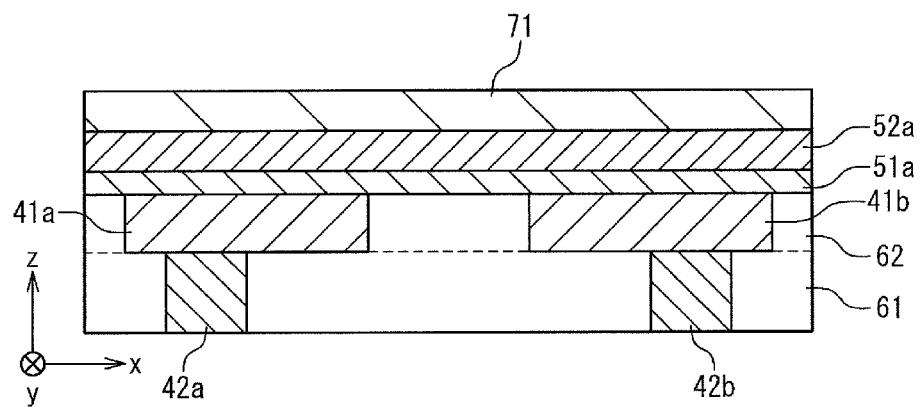
FIG. 14B is an xz sectional view illustrating this step.
Figure 14C:
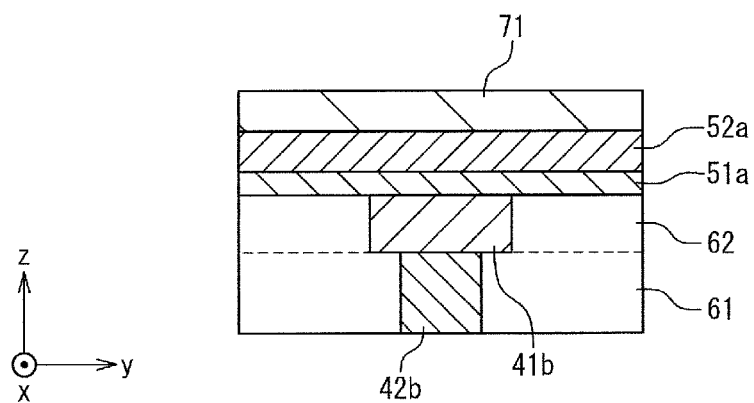
FIG. 14C is a yz sectional view illustrating this step.

Next, as illustrated in FIGS. 14A, 14B and 14C, a film 51a for an underlying layer 51, and a film 52a for a middle layer 52 are deposited on the entire upper surface by sputtering. Subsequently, a hard mask 71 (SiOx/SiNx) is deposited thereon by chemical vapor deposition (CVD).

Figure 15A:
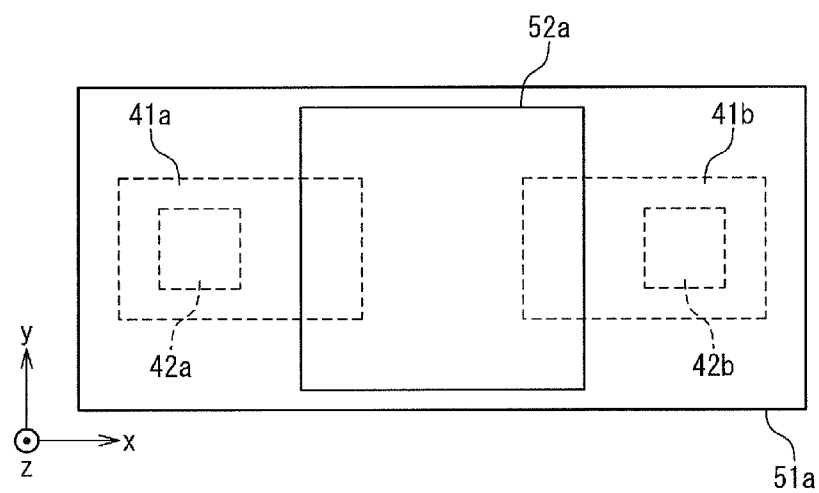
FIG. 15A is a plane view illustrating a step in the manufacturing method.
Figure 15B:
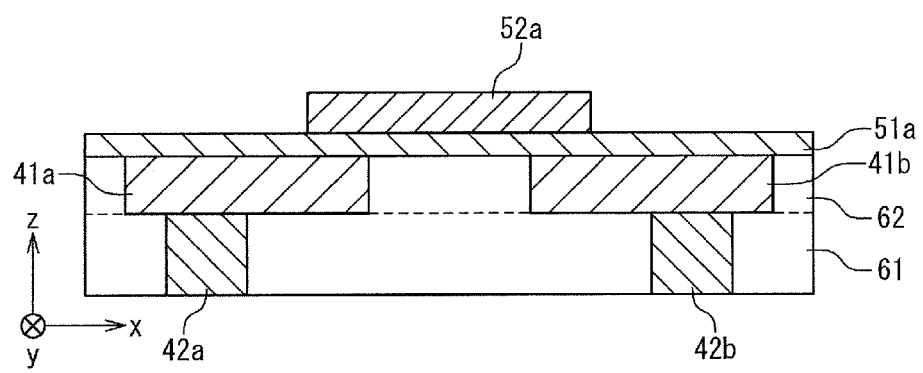
FIG. 15B is an xz sectional view illustrating this step.
Figure 15C:
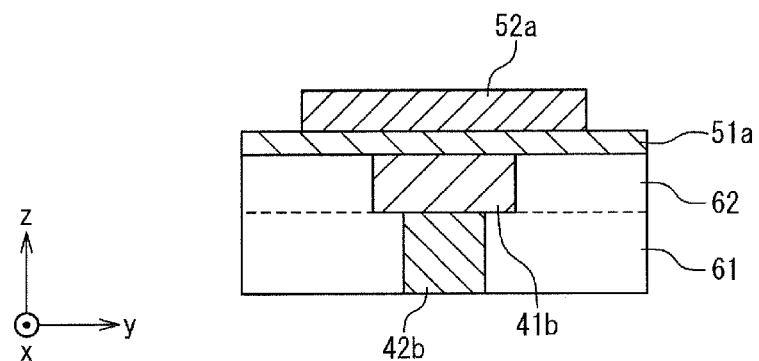
FIG. 15C is a yz sectional view illustrating this step.

Next, as illustrated in FIGS. 15A, 15B and 15C, the hard mask 71 is patterned through a PR step and an etching step. The hard mask 71 is used as a mask to etch the film 52a for the middle layer 52. Thereafter, the hard mask 71 is removed. At this time, the film 51a for the underlying layer 51 is left without being etched. In this way, the film 52a for the middle layer 52 is formed to overlap its both end regions with one end region of the first magnetization fixed layer 41a, and one end region of the second magnetization fixed layer 41b, these two end regions being faced toward each other.

Figure 16A:
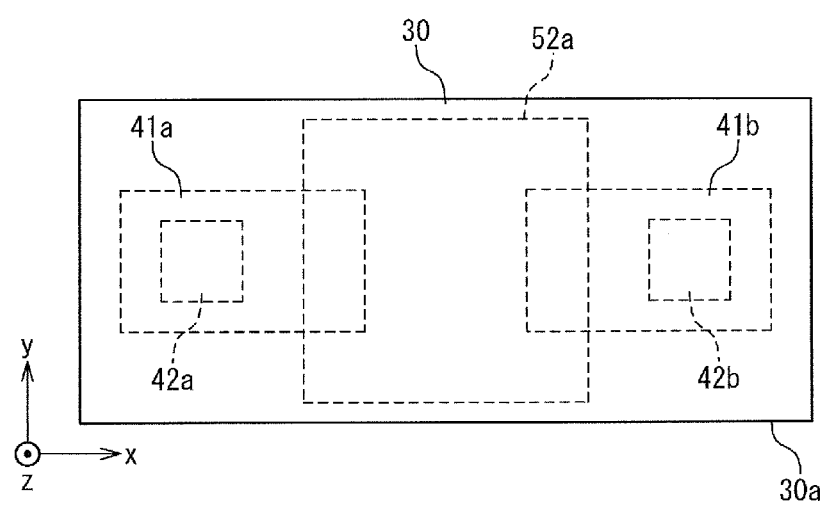
FIG. 16A is a plane view illustrating a step in the manufacturing method.
Figure 16B:
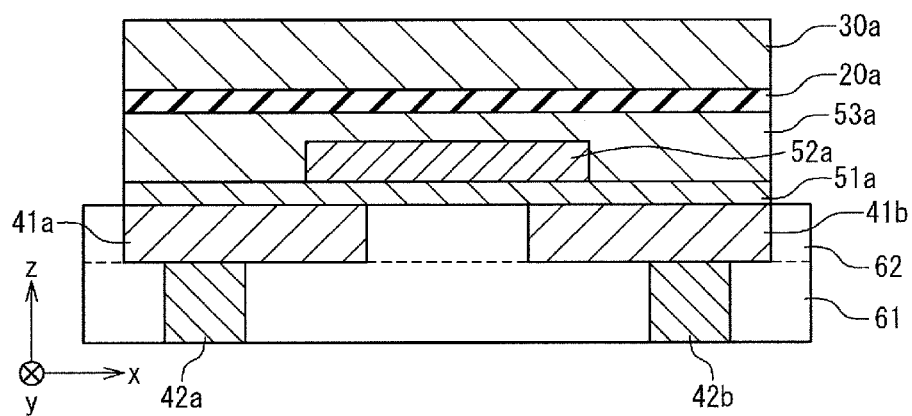
FIG. 16B is an xz sectional view illustrating this step.
Figure 16C:
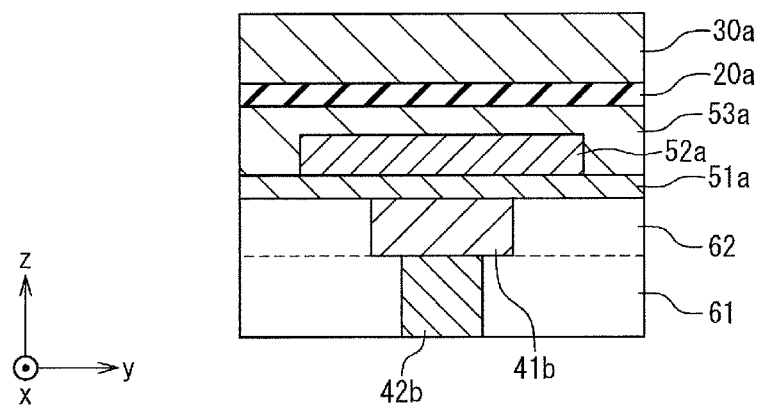
FIG. 16C is a yz sectional view illustrating this step.

Subsequently, as illustrated in FIGS. 16A, 16B and 16C, a film 53a for a data memorizing layer 53, a film 20a for a spacer layer 20, and a film 30a for a reference layer 30 are deposited over the film 51a for the underlying layer 51, and the film 52a for the middle layer 52 by sputtering.

Figure 17A:
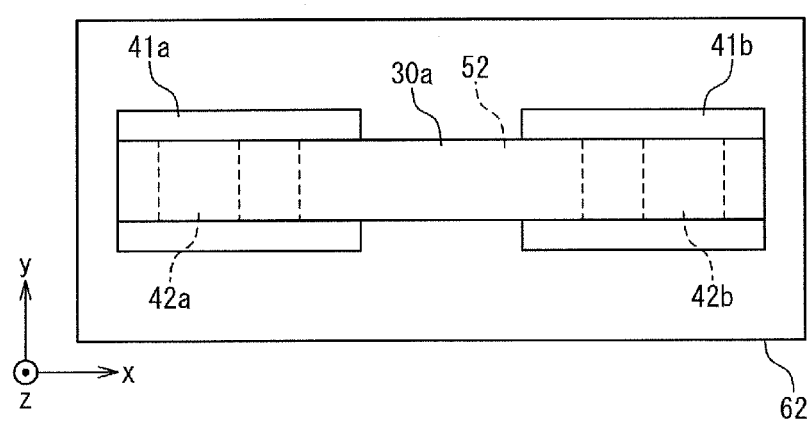
FIG. 17A is a plane view illustrating a step in the manufacturing method.
Figure 17B:
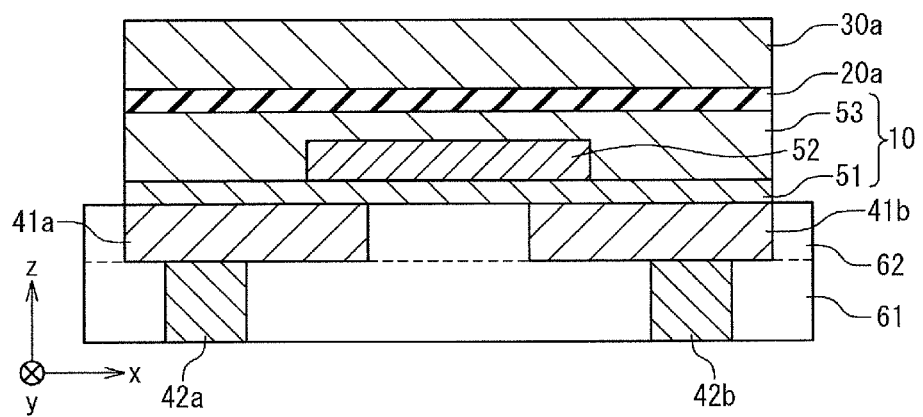
FIG. 17B is an xz sectional view illustrating this step.
Figure 17C:
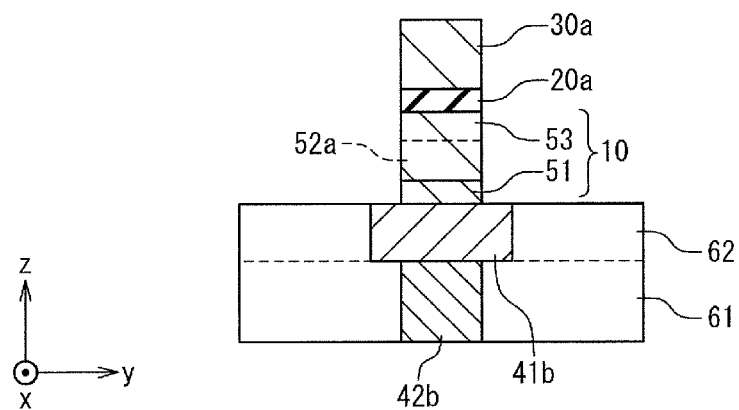
FIG. 17C is a yz sectional view illustrating this step.

Thereafter, as illustrated in FIGS. 17A, 17B and 17C, the film 30a for the reference layer 30, the film 20a for the spacer layer 20, the film 53a for the data memorizing layer 53, the film 52a for the middle layer 52, and the film 51a for the underlying layer 51 are worked through a PR step and an etching step to make the shape of each of these layers consistent with the shape of the data memorizing layer 53 and the underlying layer 51. In this way, the data memorizing layer 53, the middle layer 52 and the underlying layer 51 are formed.

Figure 18A:
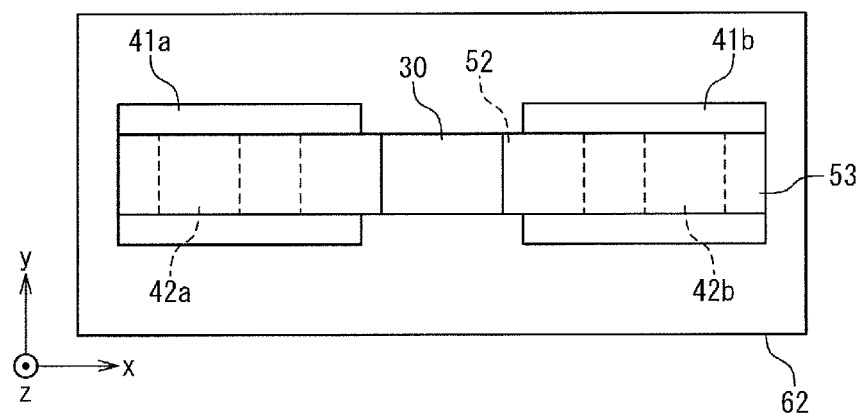
FIG. 18A is a plane view illustrating a step in the manufacturing method.
Figure 18B:
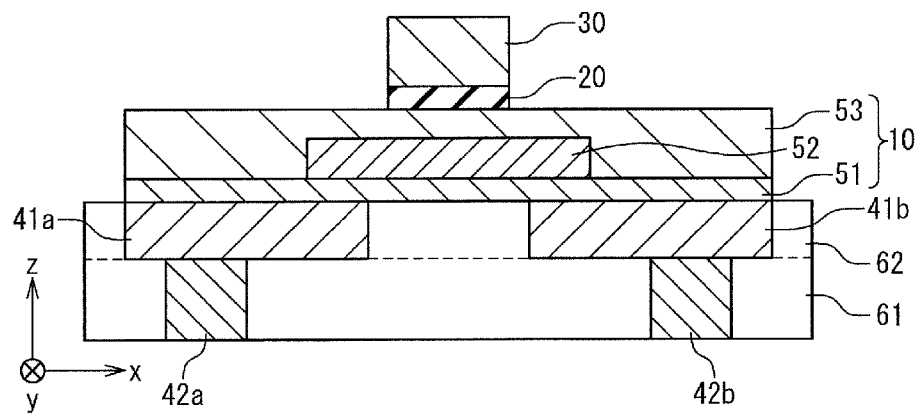
FIG. 18B is an xz sectional view illustrating this step.
Figure 18C:
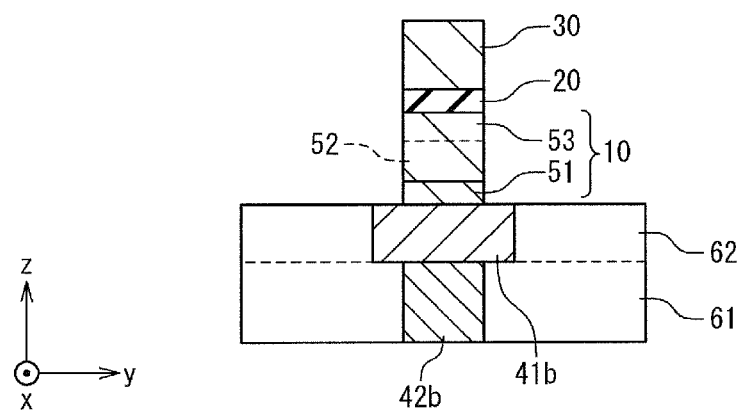
FIG. 18C is a yz sectional view illustrating this step.

Subsequently, as illustrated in FIGS. 18A, 18B and 18C, the film 30a for the reference layer 30, and the film 20a for the spacer layer 20 are worked through a PR step and an etching step to make the shape of each of these layers consistent with the shape of the reference layer 30. In this way, the reference layer 30 and the spacer layer 20 are formed. In the steps described hereinbefore, a magnetoresistance effect element 70a is formed. Subsequently, upper interconnects of the magnetic memory cells are formed.

Through the above-mentioned process, the magnetic memory according to the embodiment is produced.

Figure 19A:
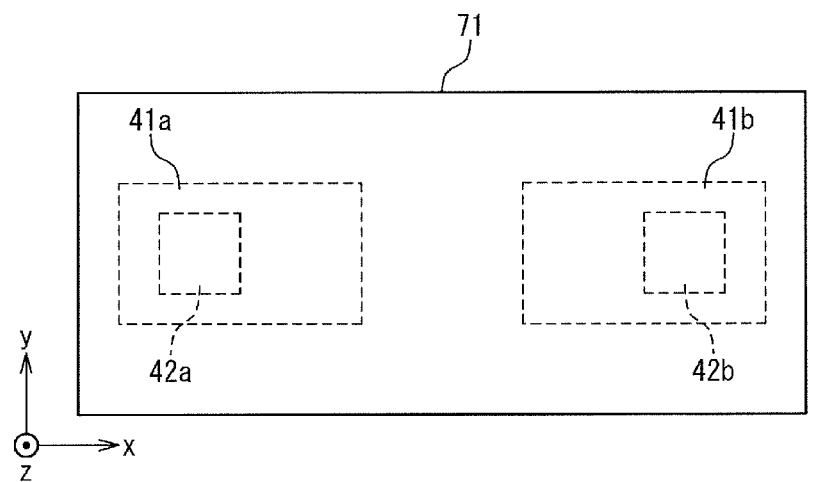
FIG. 19A is a plane view illustrating a step in a modified example of the manufacturing method.
Figure 19B:
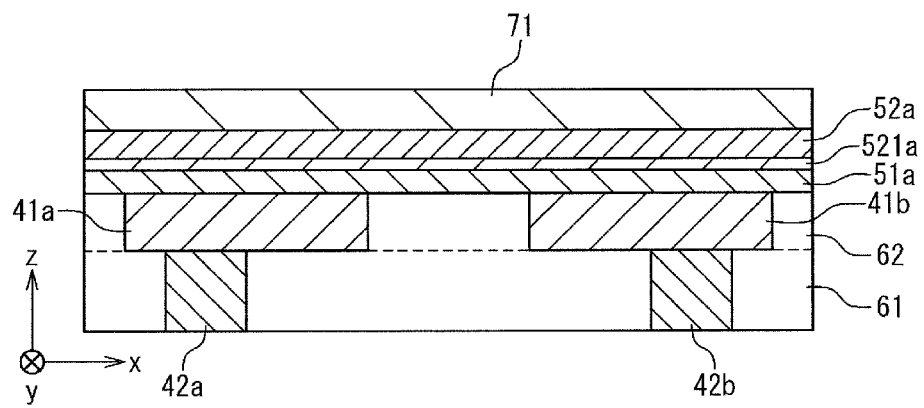
FIG. 19B is an xz sectional view illustrating this step.
Figure 19C:
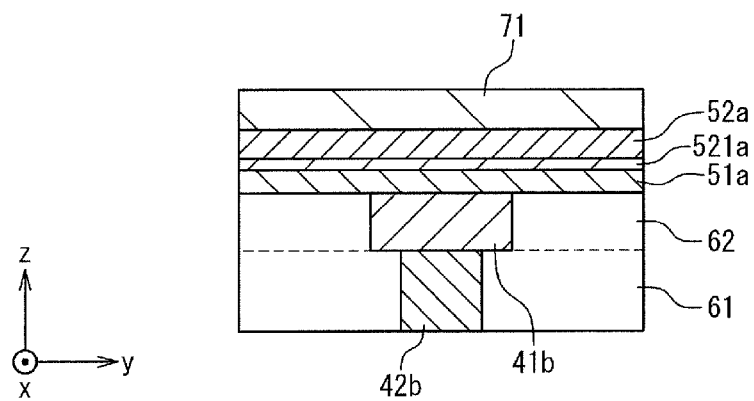
FIG. 19C is a yz sectional view illustrating this step.
Figure 20A:
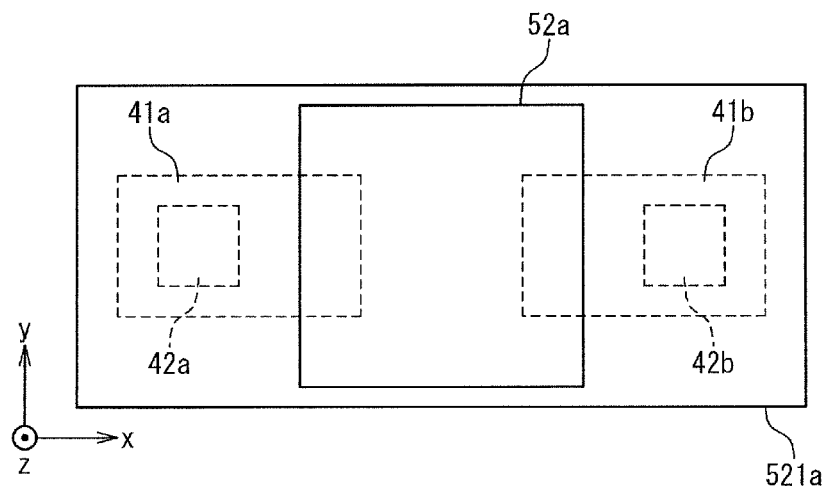
FIG. 20A is a plane view illustrating another step in the modified example of the manufacturing method.
Figure 20B:
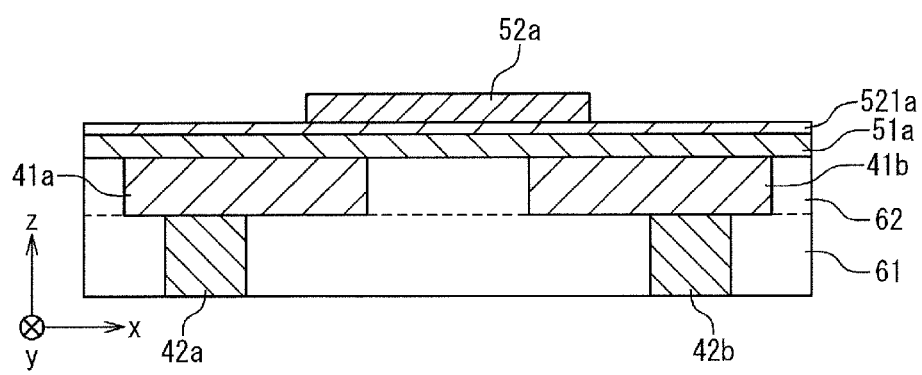
FIG. 20B is an xz sectional view illustrating this step.
Figure 20C:
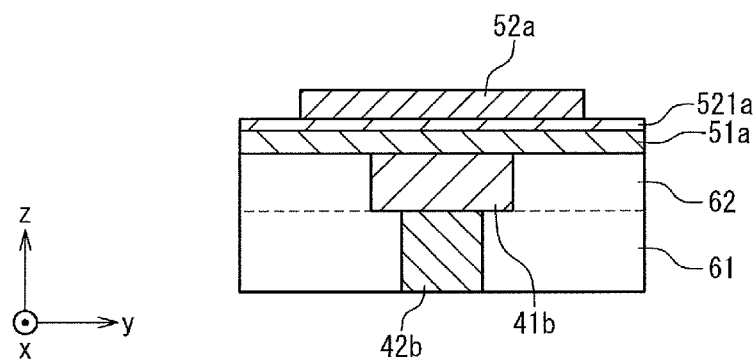
FIG. 20C is a yz sectional view illustrating this step.

In the step illustrated in FIGS. 14A, 14B and 14C, a film for a protective film may be deposited between the film 51a for the underlying layer 51, and the film 52a for the middle layer 52 by sputtering. FIGS. 19A, 19B and 19C are a plan view, an xz sectional view, and a yz sectional view, respectively, that illustrates a step in a modified example of the manufacturing method of the magnetic memory according to the second embodiment of the invention; and FIGS. 20A, 20B and 20C are also the same. In this case, the step illustrated in FIGS. 14A, 14B and 14C is substituted by a step illustrated in FIGS. 19A, 19B and 19C; and that illustrated in FIGS. 15A, 15B and 15C, by a step illustrated in FIGS. 20A, 20B and 20C. Steps before and after each of the substitution steps are the same as described above.

As illustrated in FIGS. 19A, 19B and 19C, a film 51a for an underlying layer 51, a film 521a for a protective film 521, and a film 52a for a middle layer 52 are deposited by sputtering. Subsequently, a hard mask 71 (SiOx/SiNx) is deposited by CVD.

Next, as illustrated in FIGS. 20A, 20B and 20C, the hard disk 71 is patterned through a PR step and an etching step. The hard mask 71 is used as a mask to work the film 52a for the middle layer 52 by etching. At this time, the film 521a for the protective film 521 functions as an etching stopper film. In this way, the upper surface of the film 51a for the underlying layer 51 can be protected from undergoing etching damage. As a result, the magnetic property of the underlying layer 51 can be more stably kept with certainty. In other words, magnetic coupling can be more stably gained among the data memorizing layer 53, the underlying layer 51, and the first or second magnetization fixed layer 41a or 41b. Thereafter, the hard mask 71 is removed. In a subsequent step, the film 521a for the protective film 521 is worked in the same way as used for the working into the underlying layer 51.

The magnetic memory produced according to the embodiment can also produce the same advantageous effects as the magnetic memory according to the first embodiment.

What is claimed is:
1. A magnetic memory, comprising:
an underlying layer of a ferromagnetic body;
a first nonmagnetic layer laid over the underlying layer;
a data memorizing layer of a ferromagnetic body that is laid over the first nonmagnetic layer and has perpendicular magnetic anisotropy;

a reference layer coupled through a second nonmagnetic layer with the data memorizing layer; and
a first magnetization fixed layer and a second magnetization fixed layer that are laid underneath the underlying layer to come into contact with the underlying layer,
wherein the data memorizing layer comprises:
a magnetization liberalized region that has reversible magnetization, and overlaps with the reference layer;
a first magnetization fixed region that is coupled with a first boundary of the magnetization liberalized region, and has a magnetization direction fixed to a first direction by effect of the first magnetization fixed layer; and
a second magnetization fixed region that is coupled with a second boundary of the magnetization liberalized region, and has a magnetization direction fixed to a second direction reverse to the first direction by effect of the second magnetization fixed layer, and
wherein a portion of the first nonmagnetic layer that is a portion underneath the magnetization liberalized region is thicker than a portion of the first nonmagnetic layer that is a portion underneath each of the first and second magnetization fixed regions.

2. The magnetic memory according to claim 1,
wherein the film thickness of the first nonmagnetic layer portion underneath each of the first and second magnetization fixed regions is zero,
wherein the bottom of the magnetization liberalized region comes into contact with the first nonmagnetic layer, and
wherein the respective bottoms of the first and second magnetization fixed regions come into contact with the underlying layer.

3. The magnetic memory according to claim 1, wherein the first nonmagnetic layer has a structure wherein a lower edge of the magnetization liberalized region is worked into a tapered form.

4. The magnetic memory according to claim 1, wherein the first nonmagnetic layer includes a Ta film having a film thickness of 2.0 nm or more.

5. The magnetic memory according to claim 1, wherein the first nonmagnetic layer includes an etching stopper film laid over the underlying layer.

6. The magnetic memory according to claim 1, wherein the underlying layer comprises a ferromagnetic body having perpendicular magnetic anisotropy.

* * * * *